(12) United States Patent
Choi

(10) Patent No.: US 10,546,934 B2
(45) Date of Patent: *Jan. 28, 2020

(54) NON-VOLATILE MEMORY DEVICE AND METHOD OF FABRICATING THE SAME

(71) Applicants: SK hynix Inc., Icheon (KR); SOGANG UNIVERSITY RESEARCH FOUNDATION, Seoul (KR)

(72) Inventor: Woo Young Choi, Seoul (KR)

(73) Assignees: SK hynix Inc., Icheon (KR); SOGANG UNIVERSITY RESEARCH FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/647,692

(22) Filed: Jul. 12, 2017

(65) Prior Publication Data

US 2018/0019134 A1    Jan. 18, 2018

(30) Foreign Application Priority Data

Jul. 13, 2016  (KR) .................. 10-2016-0088850

(51) Int. Cl.
| | |
|---|---|
| *H01L 27/11582* | (2017.01) |
| *H01L 29/792* | (2006.01) |
| *H01L 21/28* | (2006.01) |
| *H01L 27/1157* | (2017.01) |
| *G11C 16/04* | (2006.01) |
| *H01L 27/06* | (2006.01) |
| *H01L 27/115* | (2017.01) |
| *H01L 27/11568* | (2017.01) |

(52) U.S. Cl.
CPC .... *H01L 29/40117* (2019.08); *G11C 16/0475* (2013.01); *H01L 21/28185* (2013.01); *H01L 27/0688* (2013.01); *H01L 27/115* (2013.01); *H01L 27/1157* (2013.01); *H01L 27/11568* (2013.01); *H01L 27/11582* (2013.01); *H01L 29/792* (2013.01); *G11C 16/0483* (2013.01)

(58) Field of Classification Search
CPC ......... H01L 21/28282; H01L 21/28185; H01L 27/0688; H01L 27/115; H01L 27/11568; H01L 27/1157; H01L 27/11582; H01L 29/792; G11C 16/0475; G11C 16/0483
USPC ..................................................... 365/185.27
See application file for complete search history.

(56) References Cited

U.S. PATENT DOCUMENTS

| | | | |
|---|---|---|---|
| 6,191,444 B1* | 2/2001 | Clampitt | H01L 27/115 257/288 |
| 9,343,672 B2 | 5/2016 | Park et al. | |
| 9,748,332 B1* | 8/2017 | Yang | H01L 29/0649 |
| 2005/0202622 A1* | 9/2005 | Violette | H01L 27/115 438/201 |
| 2006/0019445 A1* | 1/2006 | Chen | H01L 27/115 438/257 |

(Continued)

*Primary Examiner* — Sung Il Cho

(57) ABSTRACT

Provided are a non-volatile memory device and a method of fabricating the same. The non-volatile memory includes a channel layer, a data storage layer disposed on the channel layer, a plurality of control gates arranged on the data storage layer and spaced apart from one another, and conductive cover layers disposed on sidewalls of the control gates facing each other. The plurality of control gates includes a first conductor having a first work function. The conductive cover layers include a second conductor having a second work function that is greater than the first work function.

20 Claims, 19 Drawing Sheets

(56) References Cited

U.S. PATENT DOCUMENTS

| | | | |
|---|---|---|---|
| 2006/0166436 A1* | 7/2006 | Korber | H01L 27/105 438/257 |
| 2009/0273013 A1* | 11/2009 | Winstead | H01L 27/11526 257/315 |
| 2010/0025753 A1* | 2/2010 | Terai | H01L 27/11565 257/324 |
| 2012/0099387 A1* | 4/2012 | Shim | G11C 7/12 365/189.05 |
| 2012/0104484 A1* | 5/2012 | Lee | H01L 27/11582 257/324 |
| 2013/0264626 A1* | 10/2013 | Sawa | H01L 29/66825 257/316 |
| 2013/0334589 A1* | 12/2013 | Ahn | H01L 29/7926 257/324 |
| 2015/0008505 A1 | 1/2015 | Chien et al. | |
| 2016/0276359 A1* | 9/2016 | Oginoe | H01L 27/11582 |
| 2017/0018558 A1* | 1/2017 | Shamoto | H01L 21/0217 |
| 2017/0373082 A1* | 12/2017 | Sekine | H01L 29/40114 |
| 2018/0331219 A1* | 11/2018 | Liou | H01L 29/7843 |
| 2019/0011753 A1* | 1/2019 | Chen | G02F 1/134309 |

* cited by examiner

NON-VOLATILE MEMORY DEVICE AND METHOD OF FABRICATING THE SAME

CROSS-REFERENCES TO RELATED APPLICATION

The present application claims priority under 35 U.S.C. 119(a) to Korean Patent Application number 10-2016-0088850, filed on Jul. 13, 2016, which is herein incorporated by reference in its entirety.

BACKGROUND

1. Field of the Invention

The present disclosure relates to a semiconductor technique, and more particularly, to a non-volatile memory device and a method of fabricating the same.

2. Description of the Related Art

Due to increased demands for portable application devices, such as digital cameras, smart phones, and tablet PCs, markets for non-volatile memory devices are rapidly growing. Non-volatile memory devices include read-only memory (ROM), programmable ROM (PROM), erasable PROM (EPROM), electrically EPROM (EEPROM), and flash memory devices. Among these non-volatile memory devices, flash memory, such as NAND flash memory device, is one of the most prominent non-volatile memory devices contributing to miniaturization and high efficiency of the portable application devices.

Among flash memory devices, a charge-trap type flash memory device programs a memory cell by continuously retaining charges stored by tunneling the charges or injecting hot electrons into a charge trapping storage layer in the memory cell, and erases the memory cell by removing the stored charges. In this case, when charges stored in a programmed memory cell are lost according to lapse of the time, it is determined that the charges are erased due to reduction of a threshold voltage of the programmed memory cell, and thus a read error may occur. Therefore, in order to secure reliability of the flash memory device, excellent data retention is required.

Recently, as higher integration and larger capacity of types of non-volatile memory devices, like flash memory devices, are continuously demanded, memory cells are being continuously downscaled and demand for multi-level memory cells increases. In order to downscale memory cells and implement a reliable multi-level memory device, it is necessary to resolve deterioration of a data retention characteristic related with a change of a threshold voltage which may be caused as program charges in a charge trapping storage layer spread toward adjacent memory cells. Furthermore, the program charges moving to or accumulated in inter-memory cell areas of a charge trapping storage layer due to a programming operation, an erasing operation, or a temperature cycling operation, may deteriorate program-erase cycling characteristics of memory cells, and may also deteriorate an incremental step pulse programming (ISPP) operation on memory cells.

SUMMARY

The present disclosure provides a non-volatile memory device with improved data retention performance and a reliable program-erase cycling characteristic by suppressing accumulation of trapped charges in a space between memory cells in coping with continuous downscaling of the memory cells or multi-level programming of the memory cells.

The present disclosure also provides a method of fabricating a non-volatile memory device having the above-stated advantages.

According to an aspect of the present disclosure, there is provided a non-volatile memory device including a channel layer; a data storage layer disposed on the channel layer; a plurality of control gates arranged on the data storage layer and spaced apart from one another, the plurality of control gates comprising a first conductor having a first work function; and conductive cover layers disposed on sidewalls of control gates facing each other, the conductive cover layers comprising a second conductor having a second work function that is greater than the first work function. The conductive cover layers may be further disposed on top surfaces of the plurality of control gates.

According to an embodiment, the first conductor and the second conductor are formed from a material different from each other, and each of the first conductor and the second conductor are selected from a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, conductive nitrides thereof, and a conductive oxide thereof. According to another embodiment, the second conductor may be formed by modifying a surface of the first conductor. The surface of the first conductor may be modified by performing impurity implantation, silicidification, or a surface treatment on the surface of the first conductor.

The data storage layer may include a tunneling insulation layer contacting the channel layer; a blocking insulation layer contacting the plurality of control gates; and a charge trapping storage layer disposed between the tunneling insulation layer and the blocking insulation layer. A ratio $W_2/W_1$ of a second width $W_2$ of the conductive cover layer to a first width $W_1$ of each of the plurality of control gates may be from about 0.01 to about 0.5. A width of the conductive cover layer may be less than or equal to a half of a distance between two adjacent control gates.

The channel layer may extend in a direction vertical to a main surface of a substrate on which the non-volatile memory device is to be formed. Furthermore, the non-volatile memory device may have a SMArT structure, a bit cost scalable (BiCS) structure, a piped BiCS (P-BiCS) structure, a vertical-recess-array-transistor) structure, or a terabit cell array transistor (TCAT) structure. At least a portion of the data storage layer may fill spaces between the plurality of control gates.

According to another aspect of the present disclosure, there is provided a method of fabricating a non-volatile memory device, the method including forming an insulation layer on a substrate; forming a stack of two or more conductive layers by forming a first conductive layer having a first work function on the insulation layer and forming a second conductive layer having a second work function greater than the first work function, wherein the second conductive layer is formed on at least one of a top surface and a bottom surface of the first conductive layer; forming a stacked structure by alternately and repeatedly forming the insulation layer and the conductive layers; forming via holes vertical to the substrate by successively patterning the stacked structure in the depth-wise direction; forming data storage layers on the sidewalls of the via holes; and forming semiconductor pillars comprising channel layers in groove areas defined by the data storage layers in the via holes.

According to an embodiment, the first conductor and the second conductor are formed from a material different from each other, and each of the first conductor and the second conductor are selected from a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, or a conductive oxide thereof. Furthermore, the second conductor may be formed by modifying a surface of the first conductor. The surface of the first conductor may be modified by performing impurity implantation, silicidification, or a surface treatment on the surface of the first conductor.

The forming of the data storage layer may include forming a blocking insulation layer on the sidewall of each of the via holes so that the blocking insulation layer contacts a plurality of control gates formed by patterning the stacked structure; forming a charge trapping storage layer on the blocking insulation layer; and forming a tunneling insulation layer on the charge trapping storage layer. The tunneling insulation layer contacts the channel layer.

A ratio $W_2/W_1$ of a second width $W_2$ of the second conductive layer to a first width $W_1$ of the first conductive layer may be from 0.01 to 0.5. Furthermore, the second width of the conductive cover layer may be less than or equal to a half of a distance between control gates adjacent to each other.

The non-volatile memory device may have a SMArT structure, a bit cost scalable (BiCS) structure, a piped BiCS (P-BiCS) structure, a vertical-recess-array-transistor) structure, or a terabit cell array transistor (TCAT) structure. Furthermore, the data storage layer may be formed to fill spaces between the plurality of control gates.

According to an embodiment of the present disclosure, a conductive cover layer is formed on sidewalls of a plurality of control gates, the conductive cover layer having a work function that is greater than a work function of the control gates. The conductive cover layer suppresses a magnitude and a dispersion width of a fringing field dispersed from the sidewalls of the control gates to a channel layer, and suppresses tunneling of program charges to inter-memory cell areas of a data storage layer. As a result, accumulation of trapped charges in the inter-memory cell areas is minimized. A non-volatile memory device having improved data retention performance and a reliable program-erase cycling characteristic may be provided.

Furthermore, according to another embodiment, a method of fabricating a non-volatile memory device having the above-stated advantages may be provided.

BRIEF DESCRIPTION OF THE DRAWINGS

The above and other features and advantages of the present disclosure will become more apparent from the following embodiments and the attached drawings in which.

DETAILED DESCRIPTION OF THE INVENTION

Figure 1:
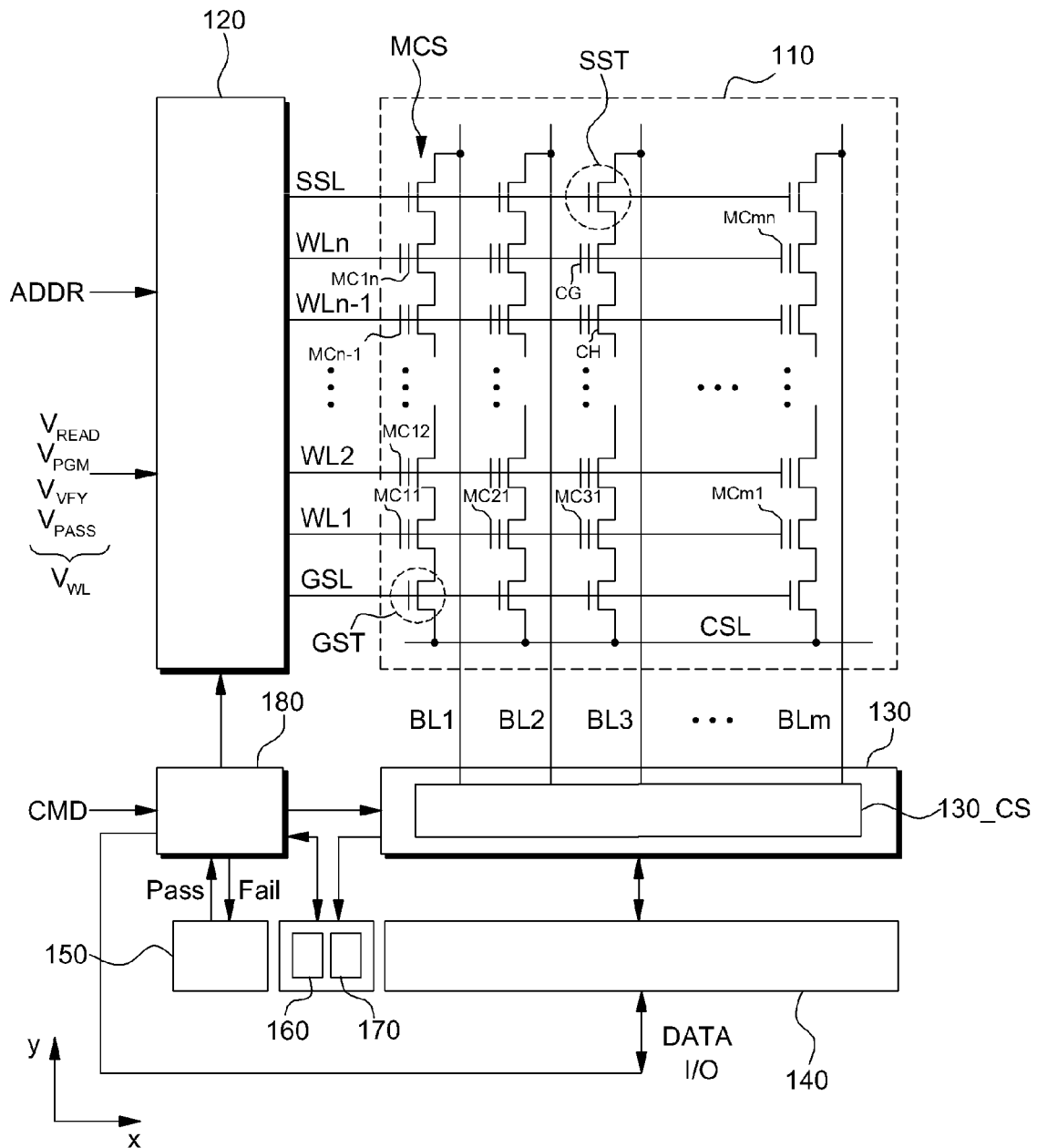
FIG. 1 is a block diagram of a non-volatile memory device according to an embodiment.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Furthermore, a structure or a form shape "adjacent to" another shape may overlap the adjacent shape or be arranged below the adjacent shape.

The relative terms including "below," "above," "upper," "lower," "horizontal," and "vertical" may be used to describe a relationship between an element, a layer, or a region and another element, another layer, or another region as shown in the drawings. It should be understood that the terms are not limited to the orientations shown in the drawings.

The present disclosure will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a block diagram of a non-volatile memory device 100 according to an embodiment.

Referring to FIG. 1, the non-volatile memory device 100 may include a memory cell array 110 including a plurality of memory cells MC11, MC12, . . . , and MCmn, a row decoder 120, a read/write circuit 130, and a column decoder 140. The memory cell array 110 may be connected to the row decoder 120 via wordlines WL1, WL2, . . . , WLn−1, and WLn, string select lines SSL, and a ground select line GSL. Furthermore, the memory cell array 110 may be connected to the read/write circuit 130 via bitlines BL1, BL2, BL3, . . . , and BLm.

When the non-volatile memory device 100 is a NAND flash memory device, the memory cell array 110 may include memory cell strings MCS, where each of the memory strings MCS consists of a plurality of memory cells, e.g., MC11, MC12, . . . , MC1n−1, and MC1n that may be connected to one another in series. String select transistors SST for selecting the memory cell strings MCS and a string select line SSL for driving the string select transistors SST may be coupled with first ends of the memory cell strings MCS, respectively. According to some embodiments, there may be two or more string select transistors SST coupled to each memory cell string MCS and two or more string select lines SSL coupled to the memory cell strings MCS according to string selection modes of a 3-dimensional non-volatile memory device.

Ground select transistors GST and a ground select line GSL for driving the ground select transistors GST may be coupled with second ends of the memory cell strings MCS, respectively. According to some embodiments, there may be two or more ground select transistors GST coupled to each memory cell string MCS and two or more ground select lines GSL coupled to the memory cell strings MCS according to string selection modes of a 3-dimensional non-volatile memory device.

The string select transistor SST and the ground select transistor GST may be called interchangeably with each other, may be referred only as either of the terms, or may be referred to commonly as select transistors, but the present disclosure shall not be limited thereby. Furthermore, the string select transistor SST and the ground select transistor GST are not limited to MOS transistors illustrated in FIG. 1, and may also have a non-volatile memory cell structure like a transistor of a memory cell MC in FIG. 1, in order to select a string by using a threshold voltage based on a certain status value.

According to some embodiments, first ends of the ground select transistors GST may be electrically connected to a common source line CSL. First ends of the string select transistors SST coupled to the memory cell strings MCS may be connected to the bitlines BL1, BL2, BL3, . . . , and BLm, respectively. The wordlines WL1, WL2, . . . , and WLn may be connected to control gate electrodes of memory cells arranged in a memory cell string MCS, respectively.

The memory cells MC11, MC21, MC31, . . . , and MCm1, which are arranged over the memory cell strings MCS and connected to a single wordline, e.g., the wordline WL1, may constitute a logic page. The number of logic pages in the memory cell array 110 may be determined based on storage capacity of the memory cells in the memory cell array 110. For example, according to storage levels, a single-level cell (SLC) memory stores 1 bit of data per memory cell, a multi-level cell (MLC) memory stores 2 bits of data per memory cell, a 8LC memory stores 3 bits of data per memory cell, and a 16LC memory stores 4 bits of data per memory cell.

In an embodiment, the plurality of memory cells MC11, MC12, . . . , and MCmn of the memory cell array 110 may have a 2-dimensional array structure parallel to a main surface of a substrate. In another embodiment, the plurality of memory cells MC11, MC12, . . . , and MCmn of the memory cell array 110 may have a vertically stacked 3-dimensional array structure including two or more stacked channel layers CH parallel to the main surface of the substrate.

The memory cells MC11, MC21, MC31, . . . , and MCm1 constituting the logical page may be programmed in a same program cycle. For example, the memory cells MC11, MC21, MC31, . . . , and MCm1 connected to the first wordline WL1 may be programmed to the same program state (or the same target value) or different program states in the same program cycle. In the case of an MLC device, since each cell stores one least significant bit (LSB) and one most significant bit (MSB), the MLC device may have four logical pages. For example, in this case, MSB pages and LSB pages on even-numbered bitlines and MSB pages and LSB pages on odd-numbered bitlines may be provided.

The row decoder 120 may select any one of a plurality of wordlines of a selected memory block. The row decoder 120 may apply a wordline voltage $V_{WL}$ from a voltage generator (not shown) to the selected wordline of the selected memory block. According to an embodiment, during a reading operation, the row decoder 120 may perform a field-effect transistor mode operation for applying a read voltage $V_{READ}$ to a selected wordline and applying a pass voltage $V_{PASS}$ to an unselected wordline. During a programming operation, a program voltage $V_{PGM}$ and a verify voltage $V_{VFY}$ may be applied to the selected wordline, whereas the unselected wordline may be grounded or a program inhibit voltage may be applied to the unselected wordline.

The cell array 110 may be addressed by the bitlines BL1, BL2, BL3, . . . , and BLm via the column decoder 140. A read/program circuit 130_CS included in the read/write circuit 130 may receive data transmitted from an external circuit or may transmit data to the external circuit via the column decoder 140.

The read/program circuit 130_CS may include a page buffer (not shown), and may operate as a sense amplifier or a program driver according to operation modes. In the present disclosure, a read/program circuit and a page buffer may be used as equivalent terms, but the present disclosure is not limited thereby. During a programming operation, the read/program circuit 130_CS receives data to be programmed from an external circuit and transmits a bitline voltage corresponding to the data to a bitline of the cell array 110. During a read operation, the read/program circuit 130_CS may read out data stored in a selected memory cell via a bitline, latch the read-out data, and output the latched data to the external circuit.

The read/program circuit 130_CS may perform a verification operation in association with the programming operation regarding the selected memory cell in response to a transmission signal transmitted from a control logic 180 and, in response to the transmission signal, may output a result of the verification operation as page buffer signals over a number of times. According to an embodiment, the read operation of the read/program circuit 130_CS may be performed based on charge integration using a bitline parasitic capacitor.

According to an embodiment, memory cells may be programmed page by page by using an incremental step pulse programming (ISPP) technique. A verification operation for determining whether a threshold voltage $V_{THR}$ of a selected memory cell reached a level of a target voltage Vth may be performed via a bitline by a current sensing circuit combined with the bitline. According to an embodiment, the current sensing circuit may be provided in the read/write circuit 130_CS.

The control logic 180 may execute program-verify loops based on the ISPP technique to program selected memory cells. A pass/fail verifying circuit 150 may verify whether a threshold voltage $V_{THR}$ of a selected memory cell reaches a desired level every time when a program loop count increases. If the selected memory cell has a desired threshold value, i.e., a target value, the program operation is determined as a program pass, and then the program operation and verification operation verifying the programming regarding the selected memory cell are terminated. However, if the memory cell does not have the desired target value, pass/fail verifying circuit 150 determines the program operation is a program fail, and then the pass/fail verifying circuit 150 may generate a count signal (not shown). The pass/fail verifying circuit 150 may determine whether the program operation is successful or not, and may transmit a result of the determination to the control logic 180.

In response to a command CMD provided by an external circuit, the control logic 180 may control the row decoder 120, the read/write circuit 130, the column decoder 140, the pass/fail verifying circuit 150, a program loop turn detector 160, and/or a comparator 170, thereby performing a pulse-program operation and a verification operation according to the ISPP technique. When a result of the program fail is received from the pass/fail verifying circuit 150, the control logic 180 may control a voltage generator (not shown) to generate a program voltage $V_{PGM}$ and a verify voltage $V_{VFY}$, and control the page buffer 130_CS to proceed a subsequent program loop. On the contrary, when the control logic 180 receives a result of the program pass, a program operation on the selected memory cell will be terminated.

In various embodiments, the control logic 180 may be integrated on a single chip with the memory cell array 110, or may be arranged on a different chip from the memory cell array 110, but the present disclosure is not limited thereto. For example, in a solid state drive (SSD), the control logic 180 may be provided at a flash translation layer (FTL), which is an independent chip separated from the memory cell array 110.

Furthermore, although the pass/fail verifying circuit 150, the program loop turn detector 160, and the comparator 170 described above are formed separately from the control logic 180, the present disclosure is not limited thereto. For example, at least one of the pass/fail verifying circuit 150, the program loop turn detector 160, and the comparator 170 may be implemented as software or hardware in the control logic 180. Furthermore, at least one of the pass/fail verifying circuit 150, the program loop turn detector 160, and the comparator 170 may be omitted, or another circuit component may be added.

Figure 2A:
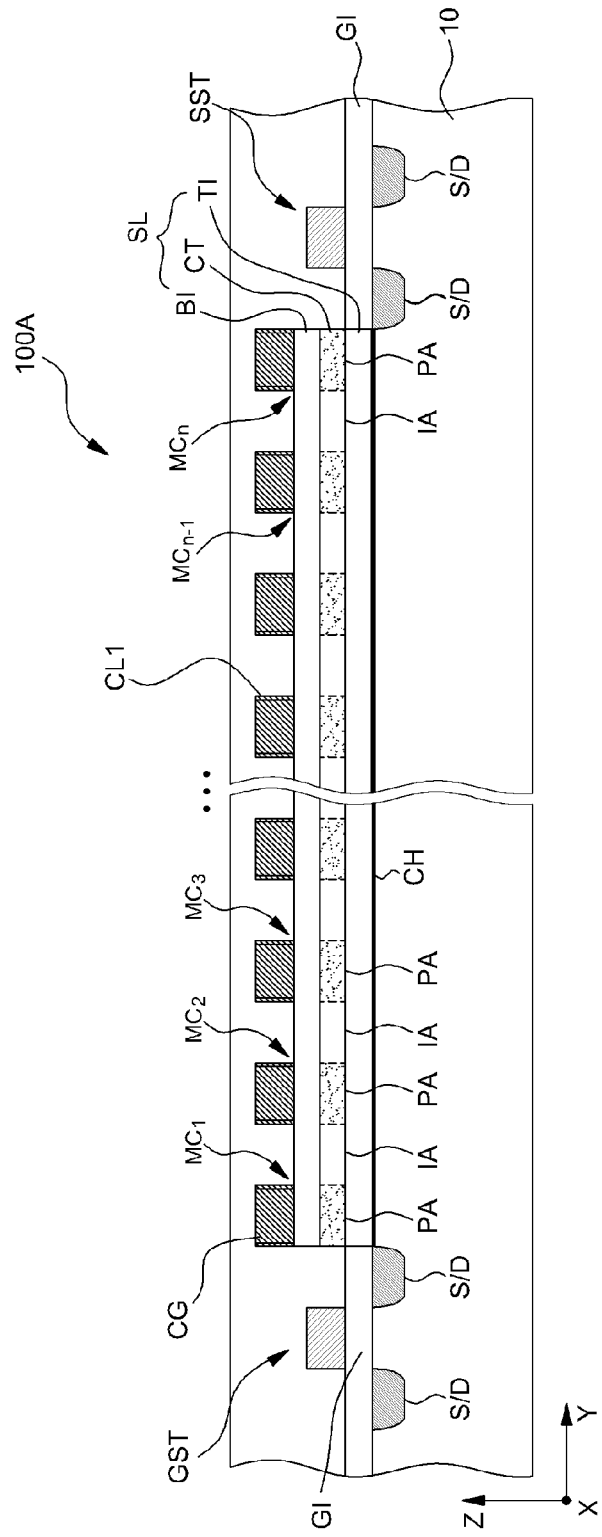
FIGS. 2A and 2B are cross-sectional views of memory cell structures of non-volatile memory devices according to various embodiments.
Figure 2B:
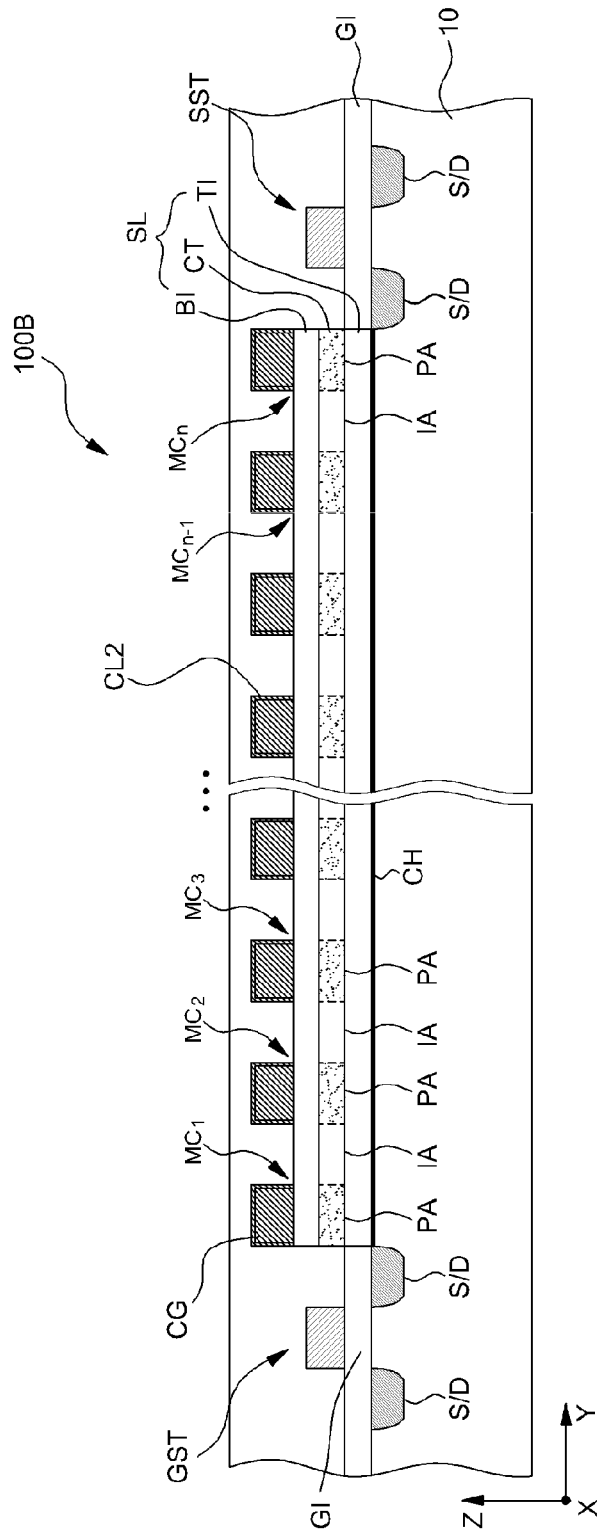

FIGS. 2A and 2B are cross-sectional views of memory cell structures of non-volatile memory devices 100A and 100B according to various embodiments of the present disclosure.

Referring to FIGS. 2A and 2B, the non-volatile memory devices 100A and 100B may include a plurality of memory cells MC1, MC2, MC3, . . . , MCn−1, and MCn formed on a substrate 10. The plurality of memory cells MC1, MC2, MC3, . . . , MCn−1, and MCn may constitute a planar-type memory cell array that is parallel to a main surface of the substrate 10.

When the non-volatile memory devices 100A and 100B are NAND flash memory devices, the plurality of memory cells MC1, MC2, MC3, . . . , MCn−1, and MCn may be aligned in a first direction, e.g., the y-axis direction, parallel to the main surface of the substrate 10, as shown in FIGS. 2A and 2B. The plurality of memory cells MC1, MC2, MC3, . . . , MCn−1, and MCn may share a channel layer CH and a data storage layer SL. The channel layer CH extends in the y-axis direction, and the data storage layer SL is disposed on the channel layer CH and extends along the channel layer CH in the y-axis direction. The channel layer CH may be coupled with a control gate CG via the data storage layer SL.

The data storage layer SL may include a first insulation layer TI, a charge trapping storage layer CT, and a second insulation layer BI. The charge trapping storage layer CT is disposed over the channel layer CH, and the first insulation layer TI is disposed between the charge trapping storage layer CT and the channel layer CH. The second insulation layer BI is disposed between the charge trapping storage layer CT and the control gate CG. The first insulation layer TI may be a tunneling insulation layer, the second insulation layer BI may be a blocking insulation layer, and the charge trapping storage layer CT may be an insulation layer including sites capable of trapping electrons or holes.

According to an embodiment, the channel layer CH may include the same material as a material constituting the substrate 10, and may be an active area disposed at a surface of the substrate 10. According to another embodiment, the channel layer CH may be an independent semiconductor structure separate from the substrate 10. For example, the channel layer CH may be a semiconductor structure formed on the substrate 10, such as a semiconductor thin-film or a semiconductor pillar.

The channel layer CH may include a single-component system semiconductor, such as silicon (Si) or carbon (C), a binary-component system semiconductor, such as silicon-germanium, silicon-carbon, indium nitride (InN), gallium arsenide (GaAS), molybdenum silicide (MoSi$_2$), or gallium nitride (GaN), or a three or more-component system compound semiconductor, such as $Al_xGa_{1-x}N$ or $In_xAl_yGa_{1-x-y}N$.

According to an embodiment, the channel layer CH may include a single layer structure including one of the above-stated materials, or may have a multi-layer structure including two or more of the above-stated materials. Furthermore, if necessary, the channel layer CH may have a strained lattice structure in order to increase mobility of charges in the channel layer CH. The channel layer CH is not limited to a 2-dimensional planar structure, and may have a 3-dimensional shape formed along a certain curvature of a surface of the substrate 10, where such the structures of the channel layer CH may be stacked or repeated at least twice in a direction that is vertical to the main surface of the substrate 10, e.g., the z-axis direction.

According to an embodiment, an impurity region, such as a source/drain area S/D, may be formed in the substrate 10. According to an embodiment, an impurity junction area may be omitted in the channel layer CH to provide a junction-free NAND structure. In the junction-free NAND structure, virtual source/drain areas may be formed due to an electrical doping effect based on a fringing field of control gates CG, thereby completing the electrical connection of memory cells in series. According to another embodiment, the channel layer CH may include an N+ conductive type dopant, and thus a junction-less NAND structure with an increased turn-on current may be provided. However, it is merely an example, and the present disclosure is not limited thereto. For example, the channel layer CH may include a P+ conductive type dopant, such that memory cell transistors operate in an enhanced mode.

The first insulation film TI may include a suitable dielectric layer having an injecting and extracting mechanism capable of transferring electrons or holes between the channel layer CH and the charge trapping storage layer CT. The first insulation film TI may contain a silicon oxide, e.g., SiO$_2$. According to another embodiment, a different dielectric layer or a stacked structure may be applied to prevent deterioration of the first insulation film TI due to repeated cycles of reading/programming operations, e.g., increase of trapped charge density or insulation destruction. Furthermore, a suitable dielectric layer may be selected for a band-engineered tunnel stack that is adjusted to improve an erasing speed while maintaining fine data retention characteristics of the memory device. The adjusted band-engineered tunnel stack may be designed to improve the erasing speed by activating hole injection to the charge trapping storage layer CT during an erasing operation and to prevent cycling deterioration of the memory device. According to an embodiment, the first insulation film TI may not only extend in a plurality of memory cells, but also extend in transistors GST and SST at respective ends of a memory string to function as gate insulation layers GI of the transistors GST and SST.

The charge trapping storage layer CT may include a dielectric layer having a high free trap density. The charge trapping storage layer CT may contain a silicon nitride or another dielectric metrical capable of trapping charges. The charge trapping storage layer CT extends to a plurality of memory cells and is shared by the plurality of memory cells, e.g., MC1, MC2, MC3, . . . , MCn−1, and MCn. Furthermore, instead of being individualized to each memory cell, the charge trapping storage layer CT may be integrally formed with a string, a page, a block, or a plane.

The integrally formed charge trapping storage layer CT includes program areas PA, which are respectively arranged below the control gates CG. The program areas PA are areas in which data is programmed or erased as charges are injected thereto or discharged therefrom according to the quantum effect of charges, e.g., the Fowler-Nordheim tunneling mechanism, based on a direction of an electric field applied between a selected control gate CG and the channel layer CH. In this regard, data may be written through the variation of threshold voltages $V_{TH}$ of respective memory cells caused by charges trapped in the program areas PA of the charge trapping storage layer CT. The integrally formed charge trapping storage layer CT further includes inter-memory cell areas IA between the program areas PA.

The second insulation film BI may include a blocking insulation layer for preventing charges trapped in the charge trapping storage layer CT from being spread to the control gate CG. The second insulation film BI may contain a silicon oxide, e.g., SiO$_2$. However, silicon oxide is merely an example, and embodiments of the second insulation film BI are not limited to silicon oxide. To improve data retention characteristics, the second insulation film BI may contain a high-k material capable of increasing a film thickness with a fine equivalent oxide film thickness (EOT). The high-k material may include aluminium oxide (Al$_2$O$_3$), yttrium oxide (Y$_2$O$_3$), silicon nitride (Si$_3$N$_4$), tantalum oxide (Ta$_2$O$_5$), lanthanum oxide (La$_2$O$_3$), hafnium oxide (HfO$_2$), or titanium oxide (TiO$_2$).

The control gates CG may be respectively coupled with wirings for addressing, e.g., the wordlines WL1, WL2, . . . , and WLn as shown in FIG. 1. The control gates CG may include a first conductor having a first work function. For example, the first conductor may include at least one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof (e.g., tungsten silicide (WSi), titanium silicide (TiSi$_2$), cobalt silicide (CoSi$_2$), nickel silicide (NiSi), platinum silicide (PtSi$_2$), erbium silicide (ErSi$_2$), or molybdenum silicide (MoSi$_2$)), a conductive nitride thereof (e.g., titanium nitride (TiN), tantalum nitride (TaN), or tantalum silicon nitride (TaSiN)), and a conductive oxide thereof (e.g., ruthenium oxide (RuO$_2$) or strontium titanium oxide (SrTiO$_3$)). However, the above-stated materials are merely examples, and embodiments are not limited thereto. The first conductor may be selected considering a work function of a second conductor used for conductive cover layers CL1 and CL2, which will be described below. In an embodiment, another conductive material having a smaller work function than the second conductor may be used as the first conductor.

The conductive cover layers CL1 and CL2 shown in FIGS. 2A and 2B, respectively, may be provided on at least sidewalls of control gates CG that face each other. According to an embodiment, as shown in FIG. 2A, the conductive cover layers CL1 may be formed only on the sidewalls of the control gates CG. According to another embodiment, as shown in FIG. 2B, the conductive cover layer CL2 may be formed on top surfaces of the control gates CG as well as on the sidewalls of the control gates CG. Since the conductive cover layers CL1 and CL2 and the control gates CG contact and are electrically connected to each other, the conductive cover layers CL1 and CL2 and the control gates CG have same potentials during operations of memory cells.

The conductive cover layers CL1 and CL2 may include a second conductor having a second work function that is greater than the first work function of the first conductor of the control gates CG. The second conductor may include at least any one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof. The material of the second conductor may be selected such that the work function thereof is greater than the work function of the first conductor. For example, when the first conductor constituting the control gate CG is molybdenum (Mo; work function $\Phi$=about 4.3 eV), the second conductor constituting the conductive cover layer CL may be molybdenum silicide (MoSi$_2$; work function $\Phi$=about 4.9 eV).

In another example, when the first conductor constituting the control gate CG is tungsten (W; work function $\Phi$=about 4.63 eV), the second conductor constituting the conductive cover layer CL may be platinum (Pt; work function 101=5.34 eV). Table 1 below shows several examples of conductors that may be used as the first and second conductors and work functions thereof.

TABLE 1

| Metal or Conductive Metal Compound (In-Vacuum Work Function (eV)) | |
|---|---|
| Mo (4.2) | MoSi$_2$ (4.9) |
| W (4.63) | WSi$_2$ (4.8), |
| Co (5.0) | CoSi$_2$ (4.36) |
| Ni (5.22) | NiSi (4.6) |
| Pt (5.34) | PtSi$_2$ (4.62) |
| Pd (5.22) | PdSi (4.6) |
| Er (3.12) | ErSi$_2$ (3.8) |
| Ti (4.33) | TiN (4.0) |
| Cr (4.5) | Mo (4.6) |
| Au (5.1) | Ir (5.27) |
| Ta (4.25) | WN$_x$ (4.3) |
| Ru (4.7) | Rh (4.98) |
| Mn (4.1) | V(4.3) |
| Zr (4.05) | Al (4.2) |
| Cu (4.6) | TaSiN (4.3) |

In another example, the conductive cover layers CL1 and CL2 may be provided by increasing a work function of a surface of the first conductor of the control gate CG by modifying the surface of the first conductor. For example, after the control gate CG is formed with the first conductor, a surface of the control gate CG may be modified by performing impurity implantation, silicidification, or another surface processing operation onto the surface of the first conductor. For example, the conductive cover layer CL2 shown in FIG. 2B may be obtained by modifying the surface of the first conductor. In particular, when the first conductor of the control gate CG includes tungsten, the second conductor including tungsten silicide having a work function greater than that of tungsten. The conductive cover layer CL2 may therefore be formed by siliciding the surface of the first conductor.

Figure 3A:
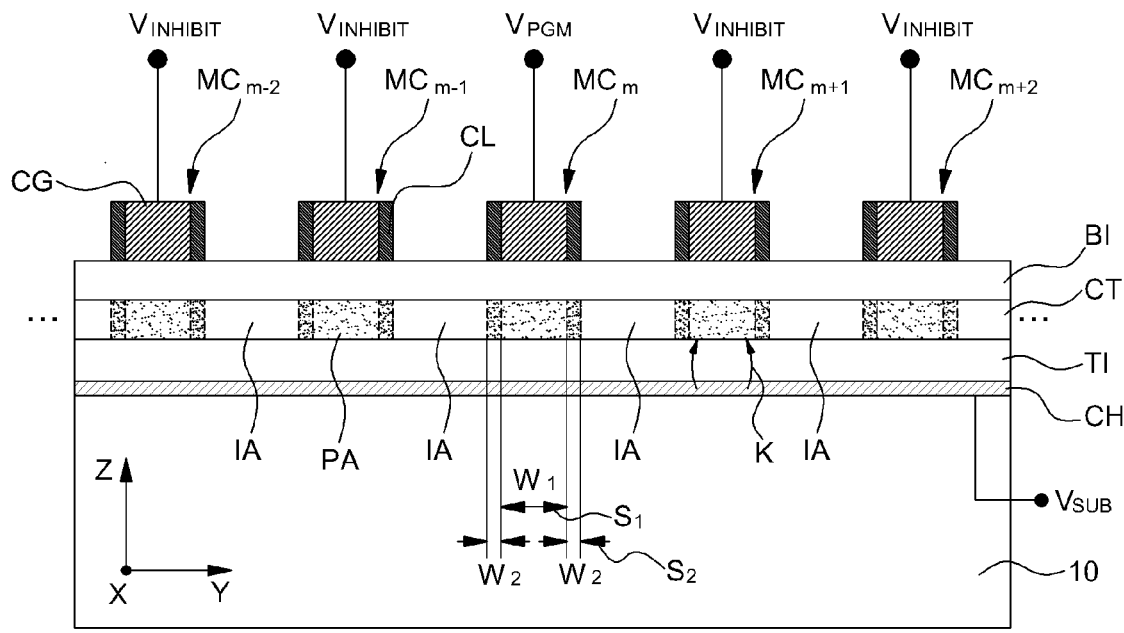
FIG. 3A is a cross-sectional view of non-volatile memory cells having a conductive cover layer according to an embodiment.
Figure 3B:
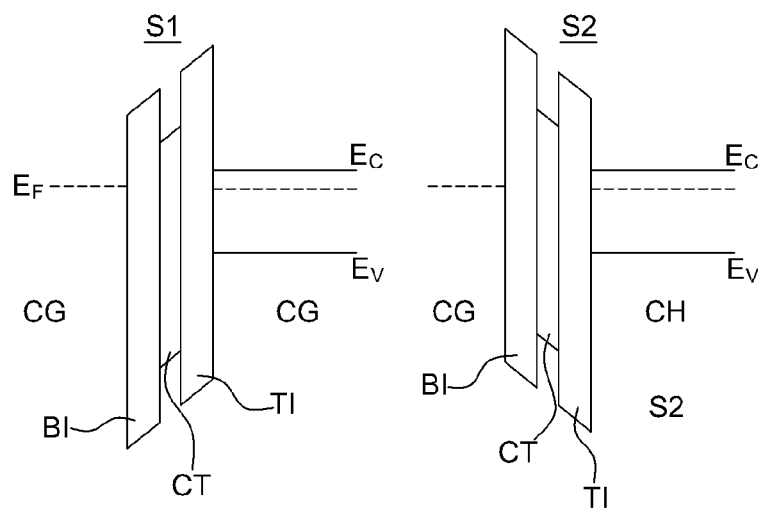
FIG. 3B is an energy band diagram corresponding to a case where a first overlap area and a second overlap area are in an equilibrium state.
Figure 3C:
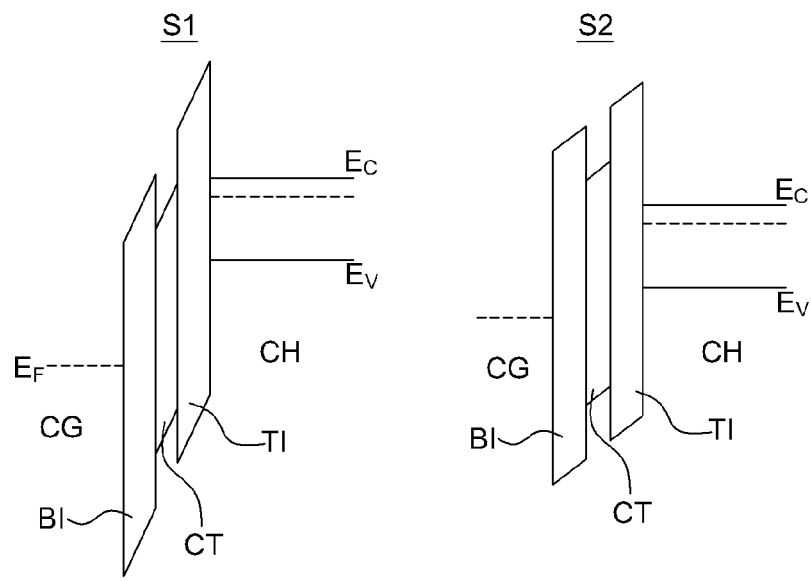
FIG. 3C is an energy band diagram showing a first overlap area and a second overlap area during a programming operation regarding non-volatile memory cells.

FIG. 3A is a cross-sectional view of non-volatile memory cells having conductive cover layers CL according to an embodiment, FIG. 3B is an energy band diagram where a first overlap area S1 and a second overlap area S2 of FIG. 3A are in an equilibrium state, and FIG. 3C is an energy band diagram showing the first overlap area S1 and the second overlap area S2 of FIG. 3A during a programming operation regarding non-volatile memory cells.

Referring to FIG. 3A, each of control gates CG has a first width $W_1$, whereas a conductive cover layer CL formed on a sidewall of each of the control gates CG has a second width $W_2$, in a direction (e.g., the y-axis direction) parallel to a main surface of a substrate 10. The second width $W_2$ may be smaller than the first width $W_1$, and may be from about 0.01 times to about 0.5 times the first width $W_1$. When a width ratio $W_2/W_1$ is smaller than 0.01, it is difficult for the conductive cover layer CL to have a work function different from that of the control gates CG, and therefore dispersion of a fringing field may not be sufficiently suppressed. On the contrary, when the width ratio $W_2/W_1$ exceeds 0.5, it may be difficult to secure a sufficient distance between memory cells in consideration of the design rule of a non-volatile memory device. Furthermore, according to an embodiment, the second width $W_2$ may be smaller than or equal to a half of a distance between two adjacent memory cells.

Since the conductive cover layer CL has substantially the same potential as that of the control gate CG, the conductive cover layer CL expands an equipotential surface of the control gate CG with respect to a channel layer CH in a direction (e.g., the y-axis direction) parallel to an extending direction of the channel layer CH from the sidewall of the control gate CG. However, since there is a work function difference $\Delta\Phi$ between a first conductor of the control gate CG and a second conductor of the conductive cover layer CL, different energy band structures may be provided with respect to an underlying stacked structure disposed under the control gate CG and the conductive cover layer CL. The underlying stacked structure includes a blocking insulation layer BI, a charge trapping storage layer CT, a tunneling insulation layer TI, and the channel layer CH.

When the first overlap area S1 includes the control gate CG, the blocking insulation layer BI, the charge trapping storage layer CT, the tunneling insulation layer TI, and the channel layer CH, and the second overlap area S$_2$ includes the conductive cover layer CL, the blocking insulation layer BI, the charge trapping storage layer CT, the tunneling insulation layer TI, and the channel layer CH, as shown in FIG. 3A, the second overlap area S2 has a greater work function than the first overlap area S1.

In FIG. 3B, $E_F$ denotes the Fermi energy level, $E_C$ denotes an energy level of a conduction band, and $E_v$ denotes an energy level of a balance band. FIG. 3B shows a strength and a direction of an electric field applied to the tunneling insulation layer TI in the energy band structure of the second overlap area S2 compared to an energy band structure of the first overlap area S1 in an equilibrium state. As illustrated in FIG. 3B, the strength and the direction of the electric field of the second overlap area S2, as compared to the first overlap area S1, are disadvantageous for a programming operation.

As shown in FIG. 3C, when a program voltage is applied, a strength of the electric field applied to the tunneling insulation layer TI in the second overlap area S2 may be reduced compared to the electric field applied to the tunneling insulation layer TI in first overlap area S1, and thus undesired tunneling of program charges in the second overlap area S2 may be suppressed.

According to an embodiment, the control circuit 180 of FIG. 1 may program a memory cell $MC_m$, selected from among memory cells $MC_{m-2}$, $MC_{m-1}$, $MC_m$, $MC_{m+1}$, and $MC_{m+2}$, by applying program pulses to a selected control gate CG as a program voltage $V_{PGM}$ using an incremental step pulse program (ISPP) technique. The applied program pulses have amplitudes increasing step-by-step while a program loop turn is increased. The programming operation may be performed by differentiating strengths of electric fields for the selected memory cell $MC_m$ and unselected memory cells $MC_{m-2}$, $MC_{m-1}$, $MC_{m+1}$, and $MC_{m+2}$ by using a technique, such as self-boosting or self-boosted program inhibition. However, such programming techniques are merely examples, and the present disclosure is not limited thereto.

For example, referring to FIG. 3A, in the programming operation, a program voltage $V_{PGM}$ (e.g., from about 15 V to about 20 V) may be applied to the control gate CG of the selected memory cell $MC_m$, whereas, in order to prevent undesired programming, a program inhibit voltage $V_{INHIBIT}$, which is a positive voltage from about 8 V to about 10 V, may be applied to the unselected memory cells $MC_{m-2}$, $MC_{m-1}$, $MC_{m+1}$, and $MC_{m+2}$. According to an embodiment, a substrate potential $V_{SUB}$ may be grounded. Referring to the memory cell array 110 of FIG. 1, a gate electrode and a bitline of a string select transistor SST corresponding to a string including the selected memory cell $MC_m$ may be grounded, and a voltage $V_{DD}$ may be applied to the unselected memory cells $MC_{m-2}$, $MC_{m-1}$, $MC_{m+1}$, and $MC_{m+2}$. Next, as known in the art, after program pulses are applied to the selected memory cell $MC_m$, a verifying operation for determining whether the programmed memory cell $MC_m$ reached a threshold voltage (i.e., a target value) may be performed.

According to an embodiment, during the programming operation, even if the control gate CG and the conductive cover layer CL have equal potentials, a slope of the energy band of the second overlap area S2 is reduced as much as a work function difference between the control gate CG and the conductive cover layer CL compared to a slope of the energy band of the first overlap area S1, and thus an electric field between the conductive cover layer CL and the channel layer CH in the second overlap area S2 becomes smaller than an electric field between the control gate CG and the channel layer CH in the first overlap area S1.

As a result, a magnitude and dispersion of a fringing field dispersed from the sidewall of the control gate CG to the channel layer CH may be suppressed by the conductive cover layer CL. Therefore, the second overlap area S2 may be referred to as a fringing field screening area. Due to the fringing field screening area S2 according to an embodiment, tunneling of program charges to inter-memory cell areas IA of the charge trapping storage layer CT may be suppressed, and tunneling of program charges to the first overlap area S1 below the control gate CG may intensively occur as indicated by the arrow K in FIG. 3A. Therefore, a width of program areas PA of the selected memory cell $MC_m$ may be reduced or minimized.

Figure 4A:
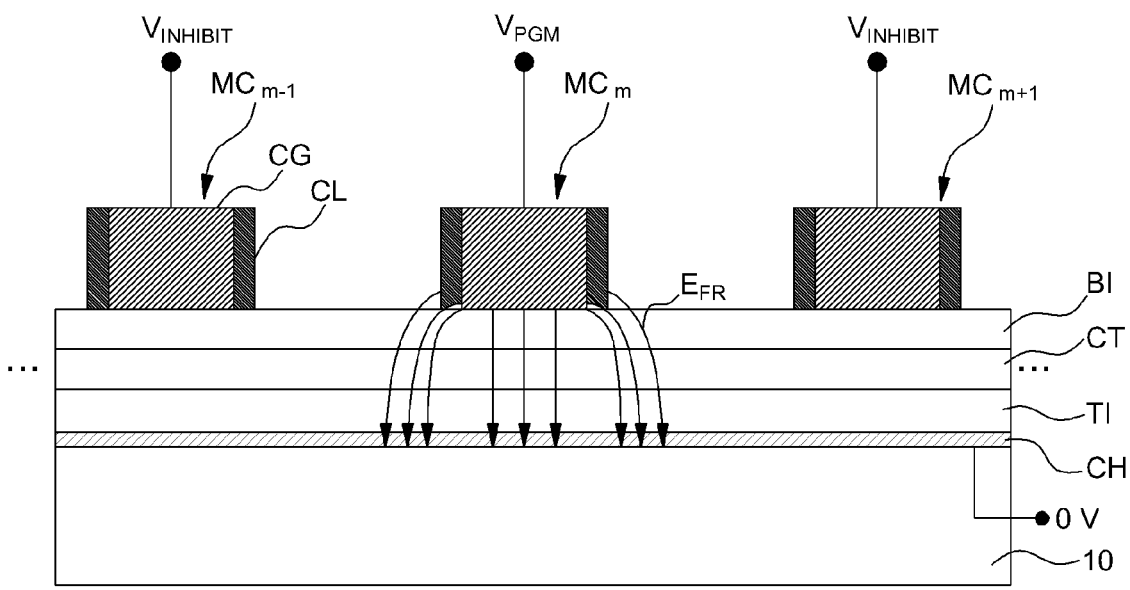
FIGS. 4A and 4B are schematic diagrams showing a distribution of electric fields during a programming operation regarding a non-volatile memory cell including a conductive cover layer and a distribution of program charges trapped in a charge trapping storage layer based on the distribution of the electric fields according to an embodiment.
Figure 4B:
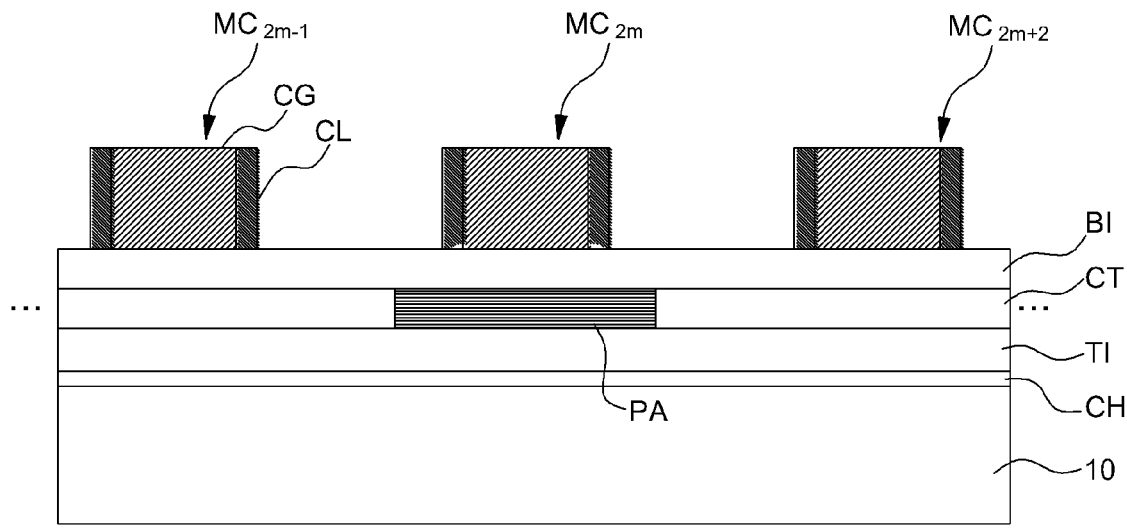
Figure 5A:
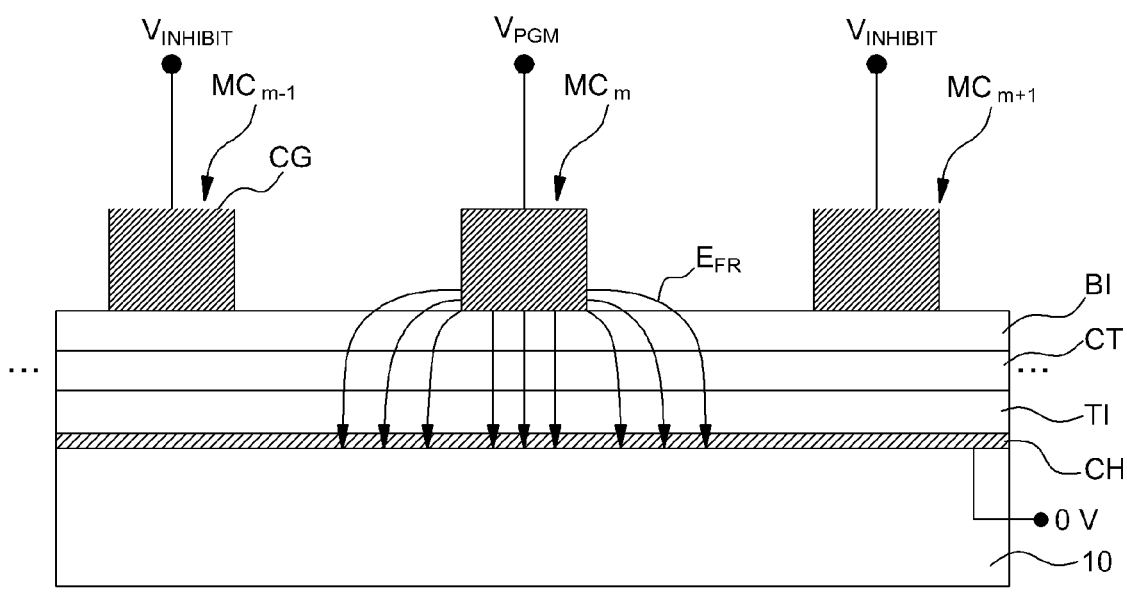
FIGS. 5A and 5B are schematic diagrams showing a distribution of electric fields during a programming operation regarding a conventional non-volatile memory cell in the related art and a distribution of program charges trapped in a charge trapping storage layer based on the distribution of the electric fields in the conventional non-volatile memory cell.
Figure 5B:
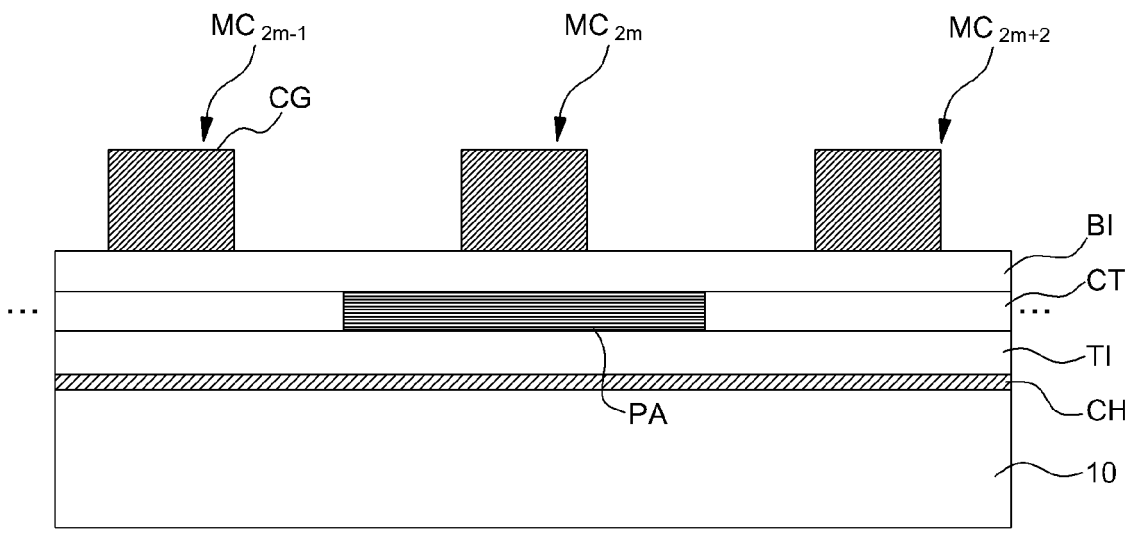

FIGS. 4A and 4B are schematic diagrams showing a distribution of electric fields during a programming operation regarding a non-volatile memory cell including a conductive cover layer CL and a distribution of program charges trapped in a charge trapping storage layer CT based on the distribution of the electric fields. FIGS. 5A and 5B are schematic diagrams showing a distribution of electric fields during a programming operation in a conventional non-volatile memory cell without a conductive cover layer and a distribution of program charges trapped in the charge trapping storage layer CT based on the distribution of the electric fields.

Referring to FIG. 4A, in order to tunnel program charges, a program voltage $V_{PGM}$ (e.g., from about 15 V to about 20 V) may be applied to the control gate CG of the selected memory cell $MC_m$, whereas a program inhibit voltage $V_{INHIBIT}$ (e.g., from about 8 V to about 10 V) may be applied to the unselected memory cells $MC_{m-1}$ and $MC_{m+1}$. During the programming operation regarding the selected memory cell $MC_m$, a magnitude and a dispersion width of a fringing field $E_{FR}$ emitted from the sidewall of the control gate CG toward the channel layer CH may be reduced or suppressed by the conductive cover layer CL. Therefore, trapping of program charges outside a first overlap area (refer to S1 in FIG. 3A), that is, in inter-memory cell areas (refer to IA in FIG. 3A) of the charge trapping storage layer CT, may be suppressed based on tunneling of program charges from the channel layer CH due to the fringing field $E_{FR}$, and trapping of program charges may intensively occur in a portion of the charge trapping storage layer CT that corresponds to the first overlap area S1.

Referring to FIG. 4B, as the magnitude and the dispersion width of the fringing field $E_{FR}$ are reduced and/or suppressed by the conductive cover layer CL, charge trappings due to tunneling outside the first overlap area S1 may be reduced and/or suppressed, and thus a distribution width of program charges, that is, a width of a program area PA may be reduced or definitely controlled.

On the contrary, referring to FIG. 5A, in the conventional memory cell structure without a conductive cover layer, even when the control gate CG includes the same material as the first conductor of the control gate CG of FIG. 4A, when, for a programming operation, a program voltage $V_{PGM}$ is applied to the control gate CG, a program inhibit voltage $V_{INHIBIT}$ is applied to control gates of the unselected memory cells $MC_{m-1}$ and $MC_{m+1}$, and the channel layer CH is grounded, a magnitude and a dispersion width of a fringing field $E_{FR}$ that is emitted from the sidewall of the control gate CG between the adjacent memory cells $MC_{m-1}$ and $MC_{m+1}$ toward the channel layer CH are greater than those of the case with the conductive cover layer CL as shown in FIG. 4A.

Therefore, referring to FIG. 5B, trapping of program charges outside a first overlap area, that is, in inter-memory cell areas (refer to IA in FIG. 3A) of the charge trapping storage layer CT due to tunneling of program charges from the channel layer CH due to the fringing field $E_{FR}$ occurs more easily than the case with the conductive cover layer CL. As a result, program charges may be distributed in the inter-memory cell areas IA, and thus a program area PA may be further expanded, compared to the program area PA of FIG. 4B.

In the conventional memory cell structure, as programming operations are repeated, program charges may be accumulated in the inter-memory cell areas IA of the charge trapping storage layer CT. As a result, resistances of portions of the channel layer CH overlapping the inter-memory cell areas IA may increase due to the accumulated program charges, and thus deterioration of transconductance and a read current may occur. Furthermore, in the charge trapping storage layer CT including a dielectric, trapped program charges may be de-trapped from the program areas PA and spread toward the adjacent memory cells $MC_{m-1}$ and $MC_{m+1}$ based on various conduction mechanisms, such as Poole-Frankel emission, hopping conduction based on tunneling of trapped electrons, and space-charge-limited-conduction (SCLC). In this case, a threshold voltage $V_{TH}$ of the programmed selected memory cell $MC_m$ is changed. In worse cases, the selected memory cell $MC_m$ may lose data, and thus a read error may occur. In addition, errors may occur in data states of adjacent memory cells.

However, according to an embodiment of the present disclosure, by maintaining a constant magnitude of an electric field applied to the channel layer CH below a control gate electrode CG and screening a sidewall of the control gate CG with the conductive cover layer CL, a fringing field screening area (S2 in FIG. 3A) suppresses a magnitude and a dispersion width of a fringing field that is emitted toward the channel layer CH via the conductive cover layer CL, thereby suppressing accumulation of program charges in the inter-memory cell areas IA of the charge trapping storage layer CT. Therefore, according to an embodiment, deterioration of memory operations due to accumulation of trapped charges in inter-memory cell areas may be prevented, and data retention performance may be improved.

Figure 6A:
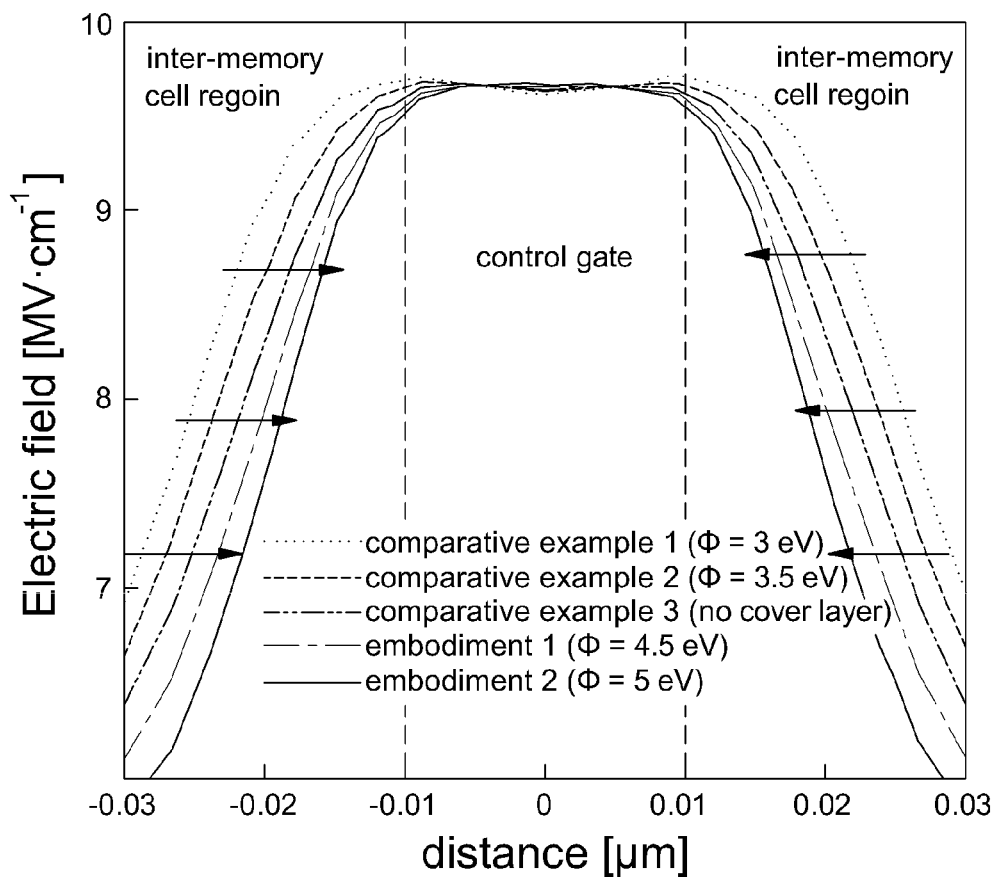
FIG. 6A is a graph showing a result of simulation for describing a fringing field distribution suppressing effect depending on changes of a work function of a conductive cover layer in a memory cell.
Figure 6B:
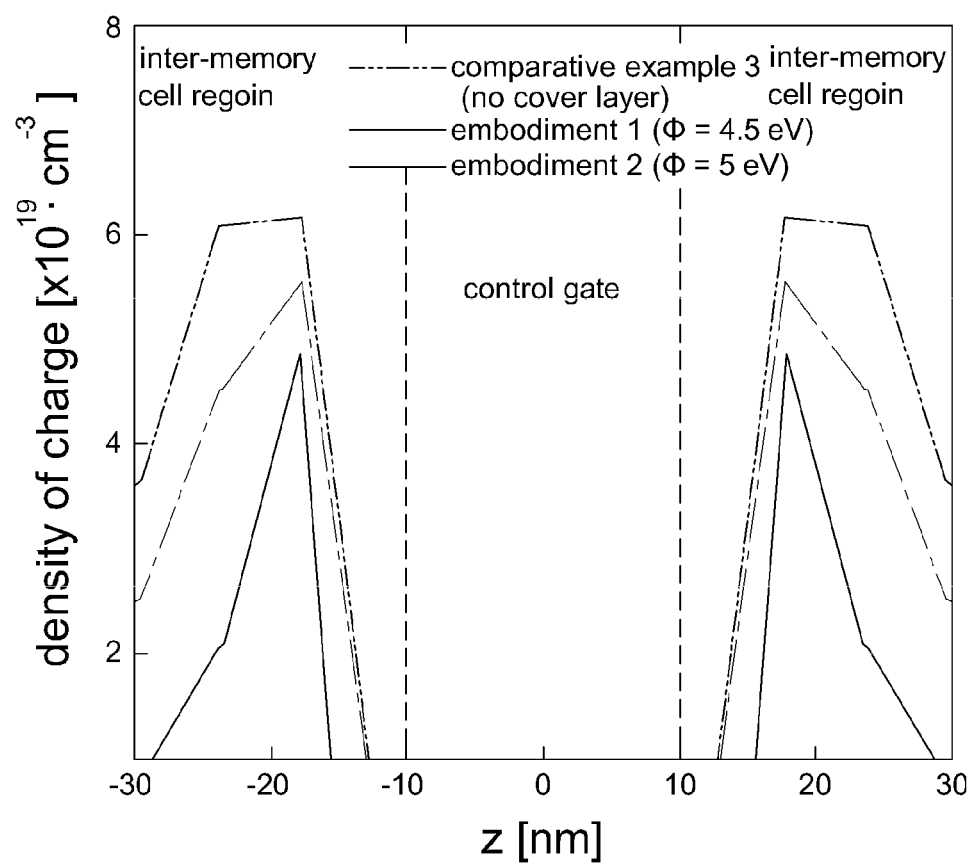
FIG. 6B is a graph showing a result of simulation for describing a density distribution of program charges accumulated in a charge trapping storage layer depending on changes of a work function of a conductive cover layer in a memory cell.

FIG. 6A is a graph showing a result of simulation for describing a fringing field distribution suppressing effect depending on changes of a work function of a conductive cover layer, and FIG. 6B is a graph showing a result of simulation for describing a density distribution of program charges accumulated in a charge trapping storage layer.

Referring to FIG. 6A, the simulation was performed by setting a work function of a control gate to 4.17 eV and changing a work function of the conductive cover layer in the order of 3 eV (comparative example 1), 3.5 eV (comparative example 2), 4.5 eV (embodiment 1), and 5 eV (embodiment 2), wherein a case without a conductive cover layer (comparative example 3) was also analyzed. As a result, when the work function of the conductive cover layer increases, more particularly, when the work function of the conductive cover layer is greater than the work function of the control gate, a fringing field converged more toward the control gate compared to the comparative example 3, which is an example that does not include the conductive cover layer.

Referring to FIG. 6B, in consideration of a density of program charges trapped in inter-memory cell areas along with the result shown in FIG. 6A, a density and a distribution width of trapped program charges according to an embodiment were reduced compared to the comparative example 3.

Figure 7A:
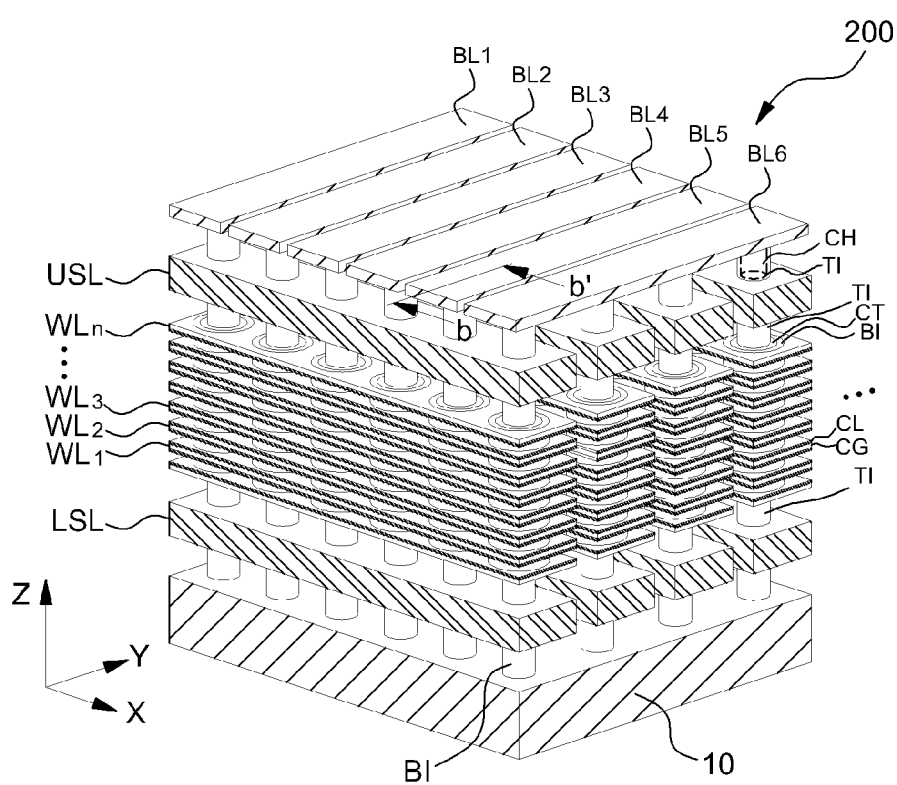
FIG. 7A is a perspective view of a 3-dimensional non-volatile memory device according to an embodiment.
Figure 7B:
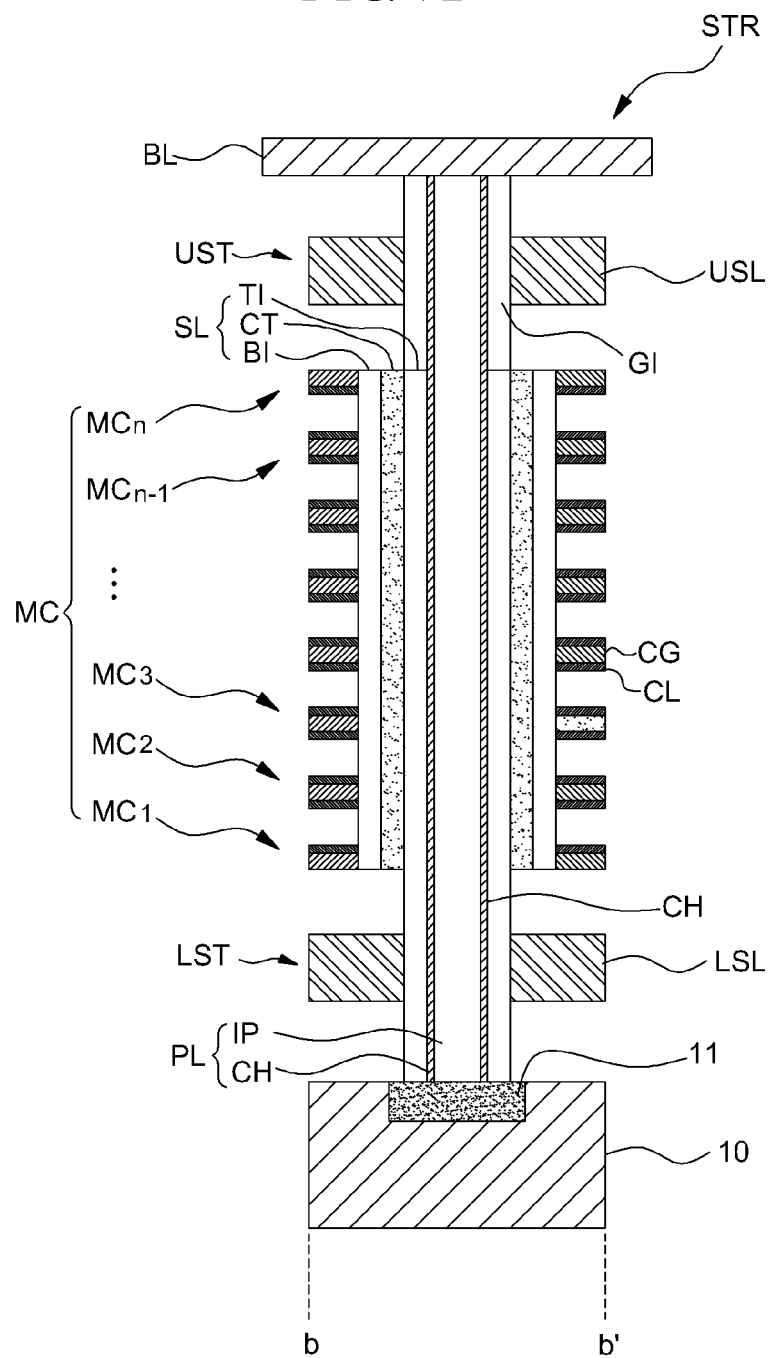
FIG. 7B is a cross-sectional view of a memory string of the 3-dimensional non-volatile memory device, taken along a line b-b of FIG. 7A.

FIG. 7A is a perspective view of a 3-dimensional non-volatile memory device 200 according to an embodiment, and FIG. 7B is a cross-sectional view of a memory string STR of the 3-dimensional non-volatile memory device 200, taken along a line b-b of FIG. 7A.

Referring to FIGS. 7A and 7B, the non-volatile memory device 200 may include a memory cell array having a plurality of memory strings STR. The memory cell array may include a plurality of bitlines BL1 through BL6, a plurality of wordlines WL1 through WLn, upper select lines USL, lower select lines LSL, and a common source line 11 (e.g., an impurity region) formed in a substrate 10. The plurality of memory strings STR may be connected between the bitlines BL1 through BL6 and the common source line 11.

The memory string STR may include string select transistors UST and LST, which correspond to the string select transistor SST and the ground select transistor GST in FIG. 1, respectively, and a plurality of memory cells MC, which are connected to one another in series between the upper string select transistor UST and the lower string select transistor LST. A drain of the upper string select transistor UST may be connected to a corresponding one of the bitlines BL1 through BL6, whereas a source of the lower string select transistor LST may be connected to the common source line 11. The common source line 11 is a wire to which sources of lower select transistors LST of the plurality of memory strings STR are connected in common.

The upper string select transistor UST may be connected to the upper select line USL, whereas the lower string select transistor LST may be connected to the lower select line LSL. There may be a plurality of upper string select transistors UST and a plurality of lower string select transistors LST in the memory cell array. Furthermore, each of the string select transistors UST and LST may have a non-volatile memory cell structure, and may have a certain status value for selecting a corresponding string. Control gates CG of the memory cells MC in the memory string STR may be coupled with wordlines WL1 through WLn, respectively.

A plurality of semiconductor pillars PL for providing channel layers CH extending in a vertical direction (i.e., the z-axis direction) may be arranged on the substrate 10, such that the string select transistors UST and LST and the memory cells MC may be connected to one another in series. The semiconductor pillars PL are not limited to a structure penetrating through conductive layers LSL, WL, and USL, and may be coupled with the conductive layers LSL, WL, and USL by contacting portions of sidewalls of the conductive layers LSL, WL, and USL.

The semiconductor pillars PL may be electrically connected to the impurity region 11 disposed in the substrate 10. As shown in FIG. 7B, each of the semiconductor pillars PL may have a core-shell structure including an insulation pillar IP as an internal core and a semiconductor material layer surrounding a sidewall of the insulation pillar IP. The semiconductor material layer will become the channel layer CH. According to another embodiment, each of the semiconductor pillars PL may be entirely a solid-type semiconductor layer or a hollow-type semiconductor layer for providing the channel layer CH.

In connection with the channel layer CH of the semiconductor pillar PL, the features of the channel layer CH described above with reference to FIGS. 2A and 2B may be referred to unless being contradictory. For example, as described above with reference to FIG. 2A, the semiconductor pillar PL may include a monocrystalline or polycrystalline semiconductor material. The semiconductor material layer may include silicon (Si), germanium (Ge), a silicon-germanium compound, or a group III-V semiconductor material, such as GaAs or InP. However, the above-stated materials are merely examples, and the present disclosure is not limited thereto. For example, the semiconductor pillar PL may provide the channel layer CH by using another semiconductor material such as carbon nano-tube, graphene, or a metal oxide. If necessary, the channel layer CH may be doped with an impurity in order to form an N+ or P+ conductive type semiconductor layer.

A data storage layer SL may be formed on a sidewall of the semiconductor pillar PL on which a plurality of memory cells of a single string are defined. The data storage layer SL may include a first insulation layer TI, a charge trapping storage layer CT, and a second insulation layer BI in the order stated in a direction from the channel layer CH toward the control gate CG. The first insulation layer TI may be a tunnelling insulation layer, whereas the second insulation layer BI may be a blocking insulation layer. The stacked structure of the insulation layers may not be individualized to each of the memory cells, and may expand to adjacent memory cells. Thus, the charge trapping storage layer CT may be shared by the plurality of memory cells constituting the single string. The tunnelling insulation layer TI may extend along the vertical direction on the sidewall of the semiconductor pillar PL to a pattern of the upper select line USL and thus may function as a gate insulation layer GI for the upper string select transistor UST. Furthermore, in an embodiment, at least a portion of the data storage layer SL may be formed along the sidewalls of the control gates CG, and may fill spaces between the control gates CG. That is, at least a portion of the data storage layer SL may extend in a direction parallel to the main surface of the substrate 10 to fill the spaces between the control gates CG adjacent to each other in the z-axis direction.

The control gate CG may include a first conductor having a first work function. For example, the first conductor may include at least one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof. However, the above-stated materials are merely examples, and the present disclosure is not limited thereto.

Conductive cover layers CL may be provided on facing surfaces, e.g., sidewalls, of the control gates CG that face each other in the z-axis direction. As shown in FIG. 7B, the conductive cover layers CL may be formed only on the sidewalls of the control gates CG, but the present disclosure is not limited thereto. For example, as shown in FIG. 2B, the conductive cover layers CL may be formed on the sidewalls and the top surfaces of the control gates CG.

The conductive cover layer CL may include a second conductor. The second conductor is different from the first conductor of the control gate CG, and has a second work function that is greater than the first work function of the first conductor. According to an embodiment, the second conductor may include at least any one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

According to an embodiment, during a programming operation of the non-volatile memory device 200, by screening a fringing field emitted from the sidewall of the control gate CG while maintaining a constant magnitude of an electric field applied to the channel layer CH disposed below the control gate CG, it is possible to suppress trapping of program charges in inter-memory cell areas of the charge trapping storage layer CT. As a result, it is possible to prevent deterioration of memory operations due to the accumulation of trapped charges in the inter-memory cell areas and to improve the data retention performance of the memory device.

The 3-dimensional non-volatile memory device having a vertical channel illustrated in FIGS. 7A and 7B is merely an example, and the present disclosure is not limited thereto. For example, as known in the art, various modifications based on various structures including SMArT, bit cost scalable (BiCS) technology, piped-BiCS (P-BiCS), vertical-recess-array-transistor (VRAT), and terabit cell array transistor (TCAT) may be applied to the illustrated 3-dimensional non-volatile memory device.

FIGS. 8A through 8G are cross-sectional views sequentially showing a method of fabricating a 3-dimensional non-volatile memory device according to an embodiment.

Figure 8A:
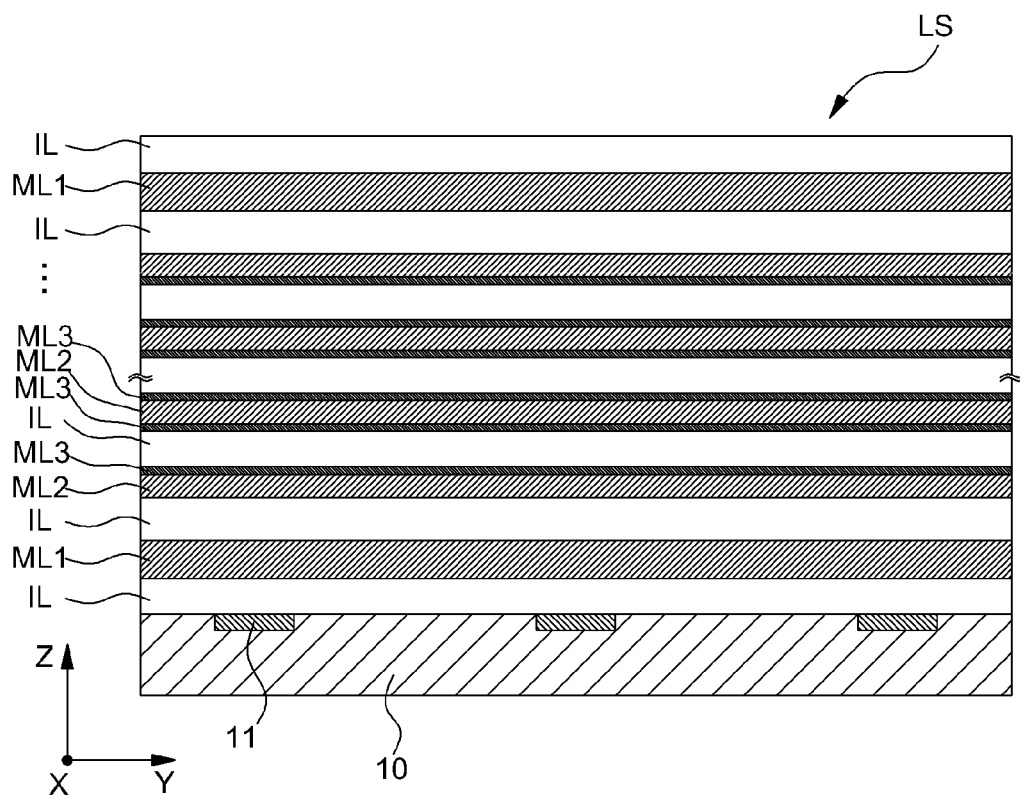
FIGS. 8A through 8G are cross-sectional views showing a method of fabricating a 3-dimensional non-volatile memory device according to an embodiment.

Referring to FIG. 8A, a substrate 10 may be provided. An impurity region 11 for forming a common source line may be formed in the substrate 10. However, it is merely an example. In other embodiments, a source/drain region contacting a portion of a memory string or one of various types of impurity regions contacting a channel layer in order to provide a string structure similar to a P-BiCS having a U-like channel layer structure may be formed. Furthermore, various driving devices including a transistor may be formed on the substrate 10.

A stacked structure LS may be formed by alternately and repeatedly stacking an insulation layer IL and two or more conductive layers ML1, ML2, and ML3 on the substrate 10. The two or more conductive layers ML1, ML2, and ML3 may include at least one or more different materials. The insulation layer IL may be an electro-insulation thin-film for electrically separating gates of string select transistors and control gates of memory cell transistors from each other. From among the conductive layers ML1, ML2, and ML3, the first conductive layer ML1 is a conductive thin-film for forming gate electrodes (e.g., LSL and USL in FIG. 7B) of the string select transistors, the second conductive layer ML2 is a conductive thin-film including a first conductor having a first work function for forming the control gates (e.g., control gate CG in FIG. 7B) of the memory cell transistors, and the third conductive layer ML3 is a conductive thin-film for forming a conductive cover layer (e.g., CL in FIG. 7B) of the memory cells. The third conductive layer ML3 contacts the second conductive layer ML2, and includes a second conductor having a second work function that is greater than the first work function. The number of times for repeatedly stacking the insulation layer IL and the conductive layers ML1 through ML3 may be determined depending on the number of memory cells and select transistors in a single memory string.

According to an embodiment, the insulation layer IL may include a silicon oxide or a silicon nitride. The first conductive layer ML1, which will become a gate electrode of a string select transistor SST or a ground select transistor GST, may include at least any one of a doped poly-silicon, aluminium (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

The second conductive layer ML2, which will become a control gate of a memory cell transistor MC, may include a first conductor having a first work function. The third conductive layer ML3, which is formed on at least one of a bottom surface and a top surface of the second conductive layer ML2 in the z-axis direction, to thereby contact the second conductive layer ML2, may include a second conductor having a second work function that is greater than the first work function. The second conductive layer ML2 has a first thickness, and the third conductive layer ML3 has a second thickness in the z-axis direction. With reference to FIG. 3A, the first thickness of the second conductive layer ML2 corresponds to the first width $W_1$, and the second thickness of the third conductive layer ML3 corresponds to the second width $W_2$. In an embodiment, a ratio $W_2/W_1$ of the second width $W_2$ of the third conductive layer ML3 to the first width $W_1$ of the second conductive layer ML2 may be from about 0.01 to about 0.5. Furthermore, according to an embodiment, the second width $W_2$ of the third conductive layer ML3 may be less than or equal to a half of a distance between the second conductive layers ML2 in the z-axis direction.

A stacked structure including the second and third conductive layers ML2 and ML3 may be formed by sequentially forming the second conductive layer ML2 and the third conductive layer ML3 by performing a thin-film forming operation, such as physical vapour deposition (PVD), chemical vapour deposition (CVD), or atomic layer deposition (ALD). According to another embodiment, the third conductive layer ML3 may be provided by performing a surface modification operation, such as an impurity implantation using plasma or heat treatment, silicidification, or a surface processing operation, onto a surface of the second conductive layer ML2 after the second conductive layer ML2 is formed. Alternatively, after the third conductive layer ML3 is formed, the second conductive layer ML2 may be provided by performing a surface reforming operation, such as an impurity implantation using plasma or heat treatment, silicidification, or a surface processing operation, on a surface of the third conductive layer ML3.

Figure 8B:
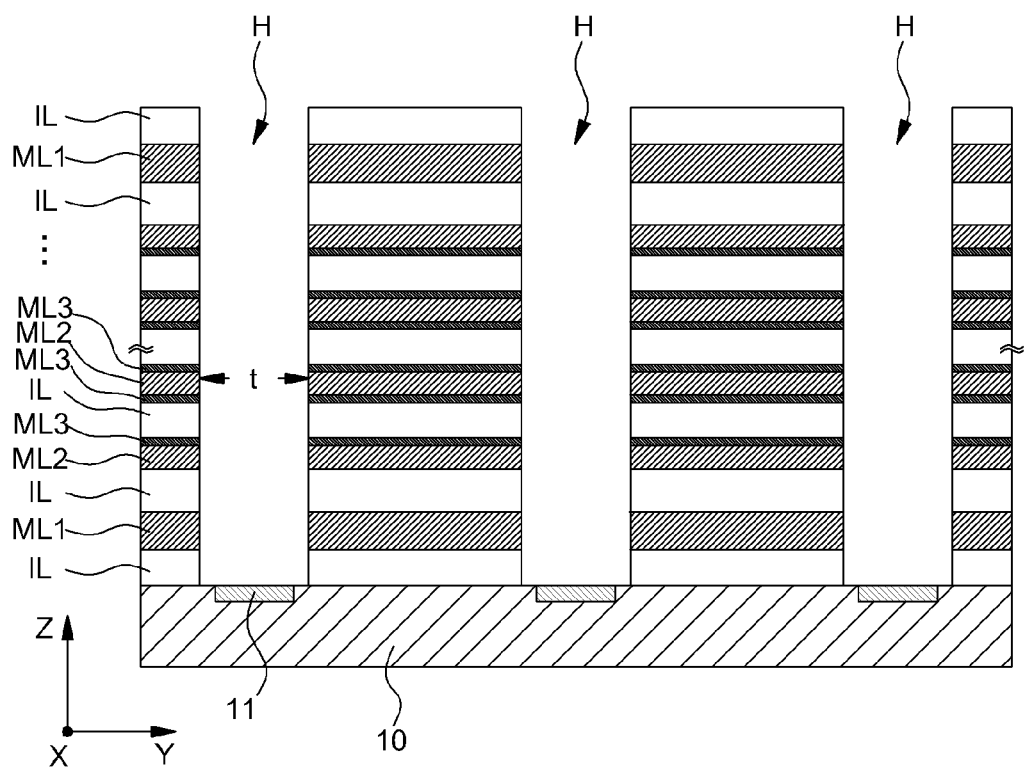

Referring to FIG. 8B, the stacked structure LS including the insulation layers IL and the conductive layers ML1 through ML3 is patterned in the depth-wise direction (i.e., the z-axis direction), thereby forming via holes H to expose the common source line 11 in the substrate 10. Memory strings are formed inside the via holes H, respectively. Therefore, a width t of each of the via holes H may be determined by considering a width of a semiconductor pillar (refer to PL in FIG. 7B) and a thickness of a data storage layer (refer to SL in FIG. 7B), which are formed later. A cross-sectional shape of each of the via holes H in a direction perpendicular to the z-axis direction may be a circular shape or an elliptical shape. However, the present disclosure is not limited thereto.

Figure 8C:
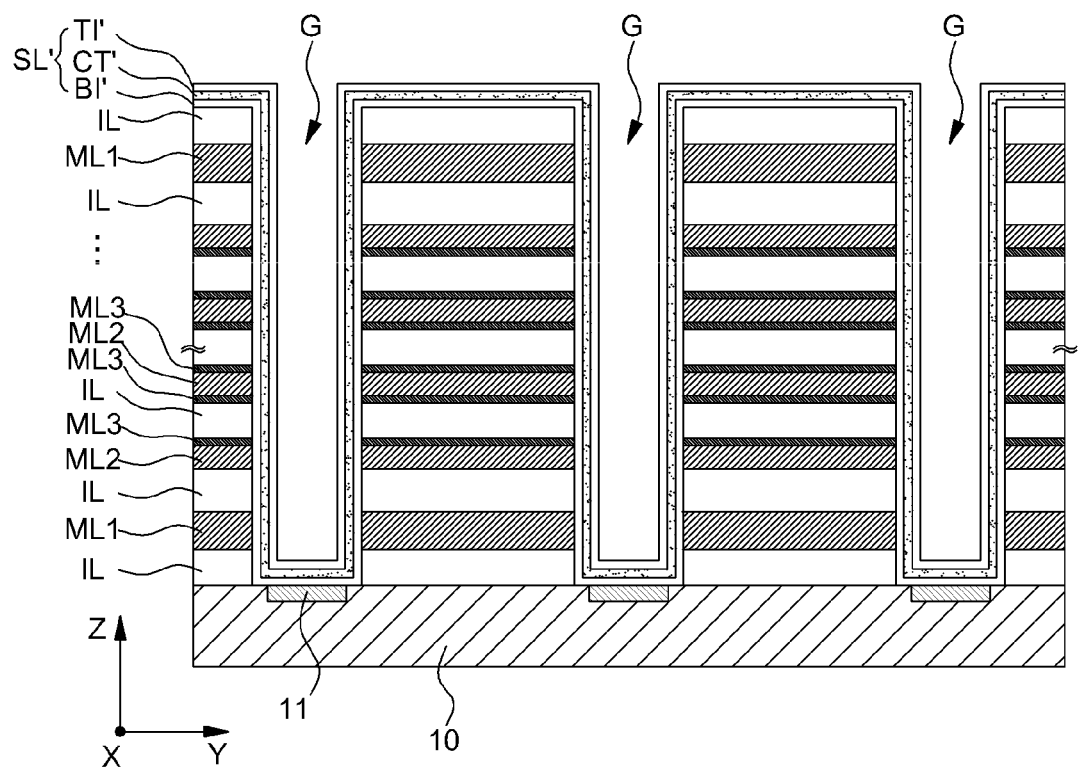

Referring to FIG. 8C, the data storage layer SL' may be formed on sidewalls of the via holes H. The data storage layer SL' may be formed by performing a thin-film forming operation with excellent step coverage, e.g., chemical vapour deposition (CVD) or atomic layer deposition (ALD), along a profile of a resultant structure of FIG. 8B. The data storage layer SL' may be provided by sequentially forming a tunnelling insulation layer TI', a charge trapping storage layer CT', and a blocking insulation layer BI', along the sidewalls and bottom surfaces of the via holes H and a top surface of a top layer of the stacked structure LS. As the data storage layer SL' partially fills the via holes H, a groove area G may be formed in the via hole H of the patterned stacked structure LS.

Figure 8D:
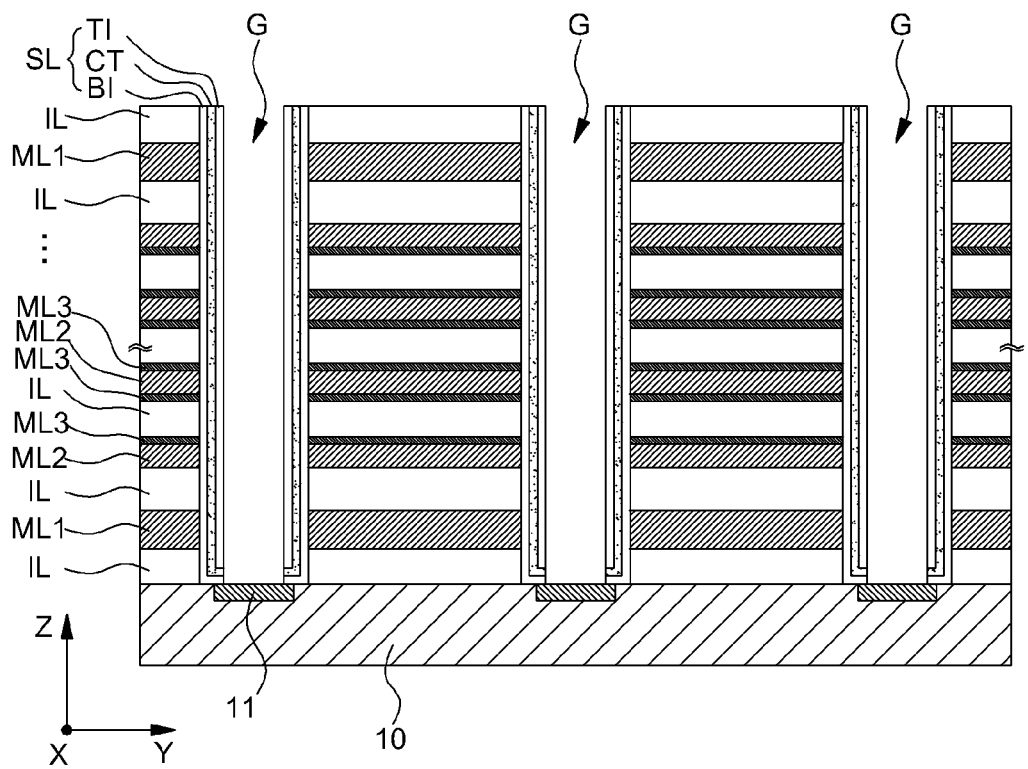

Referring to FIG. 8D, a portion of the data storage layer SL' formed over a surface of the substrate 10 may be removed. A portion of the data storage layer SL' parallel to the main surface of the substrate 10 may be removed by performing an anisotropic etch-back operation using plasma. By performing the anisotropic etch-back operation, portions of the data storage layer SL' on the top layer of the stacked structure LS and at the bottom of the groove area G may be removed, thereby exposing the common source line 11 in the substrate 10. As a result, a data storage layer SL may be provided along the sidewalls of the groove area G.

Figure 8E:
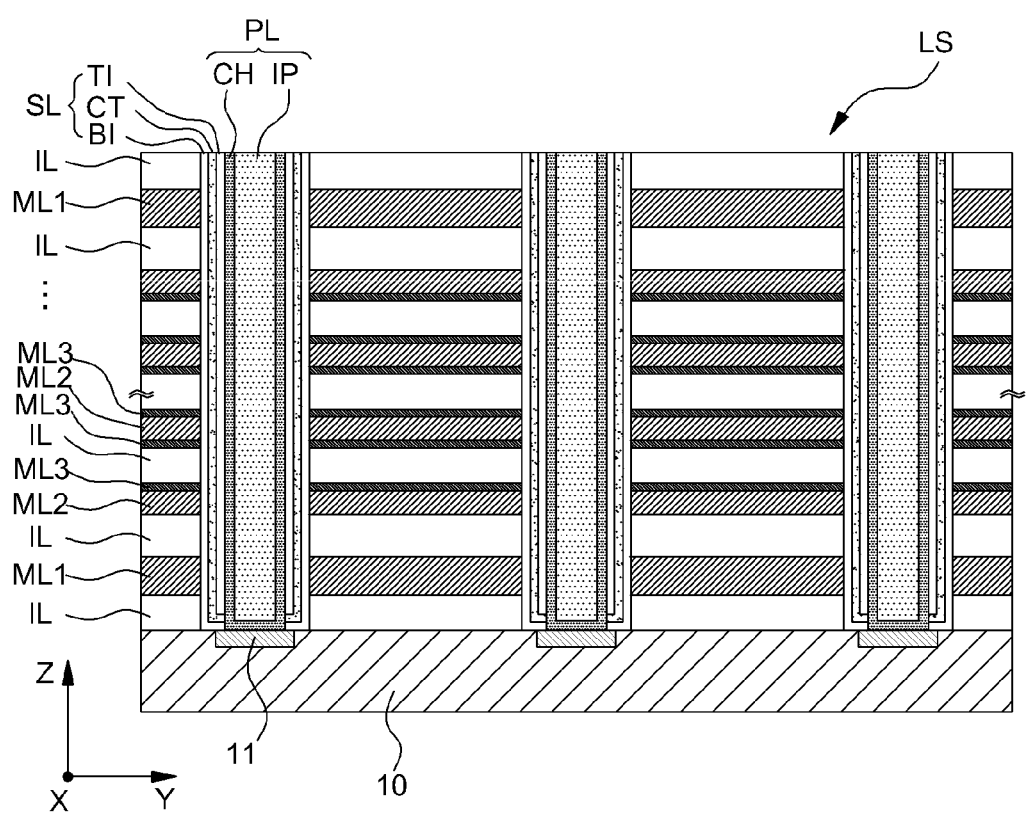

Referring to FIG. 8E, a semiconductor pillar PL including a channel layer CH extending in a direction vertical to the main surface of the substrate 10 (i.e., the z-axis direction) may be formed in the groove area G defined by the data storage layer SL. The semiconductor pillar PL may have a core-shell structure in which an internal core is an insulation pillar IP and the insulation pillar IP is surrounded by the channel layer CH. The semiconductor pillar PL is formed by forming a semiconductor material layer having a certain thickness on the sidewall and a bottom surface of the groove area G and then filling an empty portion of the groove area G with an insulator. In another embodiment, the groove area G may be entirely filled with a semiconductor material, thereby providing a solid-type semiconductor pillar. The bottom of the channel layer CH may be electrically connected to the common source line 11 formed in the substrate 10.

The descriptions given above may be referred to in relation to materials and other features of the semiconductor pillars PL, where the semiconductor pillars PL may be formed by a thin-film forming operation with excellent step coverage, e.g., chemical vapour deposition (CVD) or atomic layer deposition (ALD). Furthermore, as described above, the semiconductor pillar PL may be vertically aligned in the z-axis direction and may also have a U-like shape as in the piped BiCS (P-BiCS) structure that is known in the art.

Figure 8F:
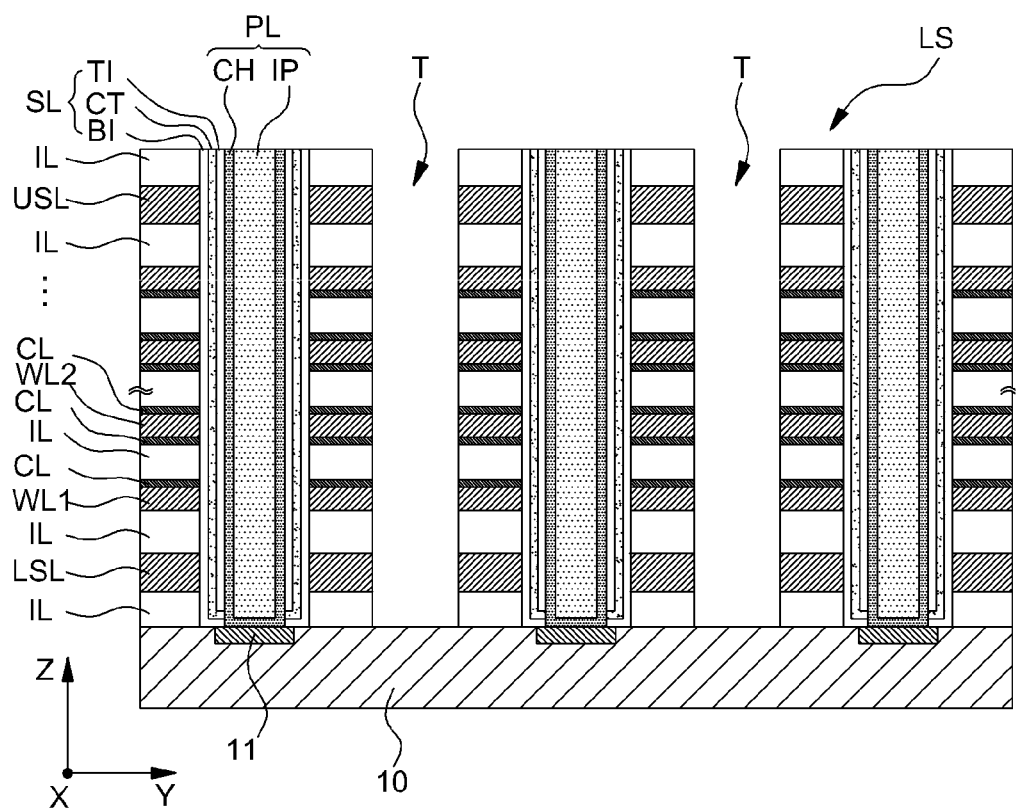

Referring to FIG. 8F, a trench T expanding in a first direction (e.g., the x-axis direction) and the vertical direction (i.e., the z-axis direction) is formed in the patterned stacked structure LS including the semiconductor pillars PL. As a result, a portion of the patterned stacked structure LS that is disposed between two adjacent semiconductor pillars PL in FIG. 8E is divided into two parts. As a result, a lower select line LSL, an upper select line USL, and wordlines WL, which are coupled with memory strings and aligned in the x-axis direction, are formed as illustrated in FIG. 7A. The conductive cover layers CL are formed on at least one of top surfaces and bottom surfaces of the wordlines WL in the z-axis direction.

Figure 8G:
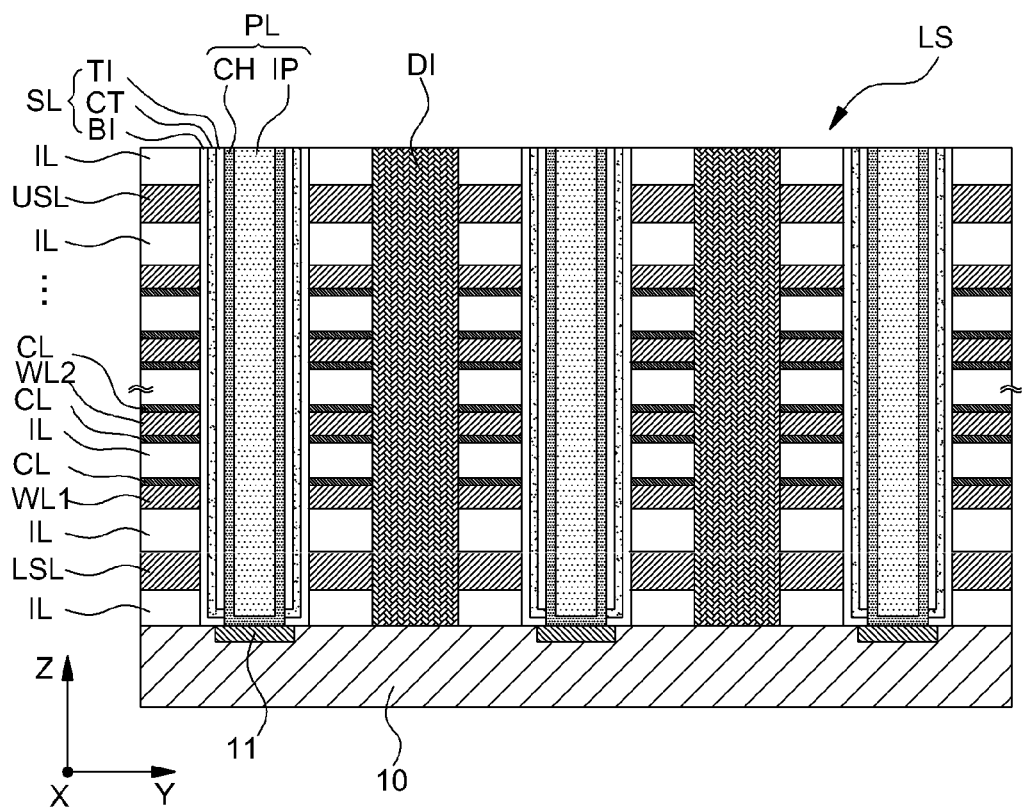

Next, referring to FIG. 8G, a device isolation layer DI may be provided by filling the trench T with an insulation layer, and the memory strings are electrically separated from one another in a second direction (e.g., the y-axis direction) by the device isolation layer DI. Next, by forming wires (not shown) like bitlines contacting the channel layers CH of the semiconductor pillars PL, the 3-dimensional non-volatile memory device 200 as shown in FIG. 7A may be provided. The channel layer CH may provide a gate all-around (GAA) structure surrounded by control gates.

Figure 9:
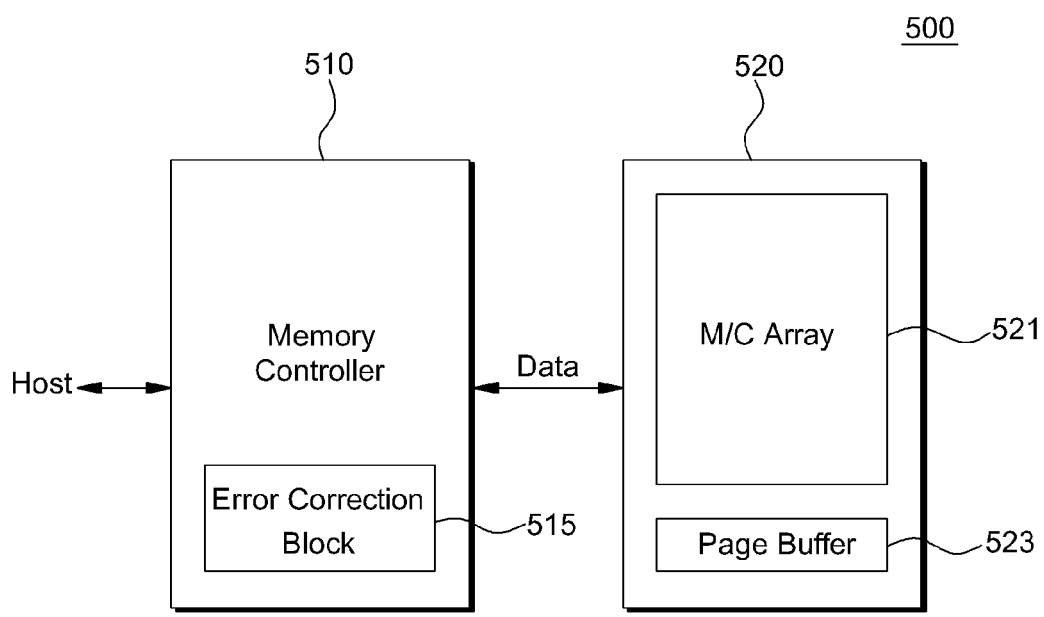
FIG. 9 is a block diagram showing a memory system according to an embodiment.

FIG. 9 is a block diagram showing a memory system 500 according to an embodiment.

Referring to FIG. 9, the memory system 500 includes a memory controller 510 and a non-volatile memory device 520. The memory controller 510 may perform error correcting codes with respect to the non-volatile memory device 520. The memory controller 510 may control the non-volatile memory device 520 based on commands and addresses from an external circuit.

The memory controller 510 may perform an error correcting encoding process on data requested to be written when the memory controller 510 receives a write request from a host. Furthermore, the memory controller 510 may control the non-volatile memory device 520 to program the encoded data at a memory region corresponding to a provided address. Furthermore, during a read operation, the memory controller 510 may perform an error correcting decoding process on data output from the non-volatile memory device 520. Errors included in output data may be corrected by the error correcting decoding process. To detect and correct the errors, the memory controller 510 may include an error correction block 515.

The non-volatile memory device 520 may include a memory cell array 521 and a page buffer 523. The memory cell array 521 may include an array of single-level memory cells or 2 or higher bit multi-level memory cells. When a programming instruction is received, according to the above embodiments, dispersion of a fringing field is restricted by employing a conductive cover layer, and thus program charges accumulated in inter-memory cell areas of a charge trapping storage layer may be reduced or suppressed.

Figure 10:
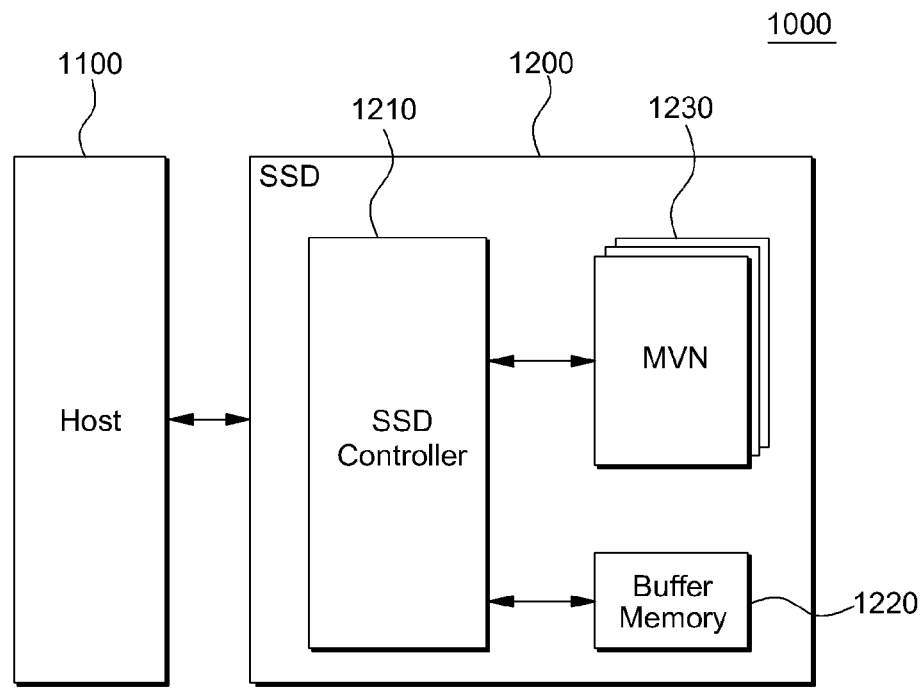
FIG. 10 is a block diagram showing a storage device including an SSD according to an embodiment.

FIG. 10 is a block diagram showing a storage device 1000 including a solid state drive (SSD) according to an embodiment of the present disclosure.

Referring to FIG. 10, the storage device 1000 includes a host 1100 and an SSD 1200. The SSD 1200 may include an SSD controller 1210, a buffer memory 1220, and a non-volatile memory device 1230. The SSD controller 1210 provides electric and physical connections between the host 1100 and the SSD 1200. In an embodiment, the SSD controller 1210 provides an interface between the host 1100 and the SSD 1200 in correspondence to a bus format of the host 1100. Furthermore, the SSD controller 1210 may decode commands provided by the host 1100 and access the non-volatile memory device 1230 based on a result of the decoding. Examples of the bus format of the host 1100 may include USB (Universal Serial Bus), SCSI (Small Computer System Interface), PCI express, ATA (Advanced Technology Attachment), PATA (Parallel ATA), SATA (Serial ATA), and SAS (Serial Attached SCSI).

Data to be written provided by the host 1100 or data read out from the non-volatile memory device 1230 may be temporarily stored in the buffer memory 1220. When the host 1100 sends a read request and data stored in the non-volatile memory device 1230 is cached, the buffer memory 1220 may provide a cache function for providing cached data directly to the host 1100. Generally, a data transmission rate based on a bus format (e.g., SATA or SAS) of the host 1100 may be faster than a data transmission speed of memory channels of the SSD 1200. In this case, the large-capacity buffer memory 1220 may minimize performance deterioration due to the speed difference. The buffer memory 1220 may be a synchronous DRAM for providing sufficient buffering performance. However, the present invention is not limited thereto.

The non-volatile memory device 1230 may be provided as a storage medium of the SSD 1200. For example, the non-volatile memory device 1230 may be a NAND-type flash memory with large storage capacity. For another example, a NOR-type flash memory, a phase-change memory, a magnetic memory, a resistive memory, a ferrodielectric memory, or a memory system including a combination thereof may be applied as the non-volatile memory device 1230.

Figure 11:
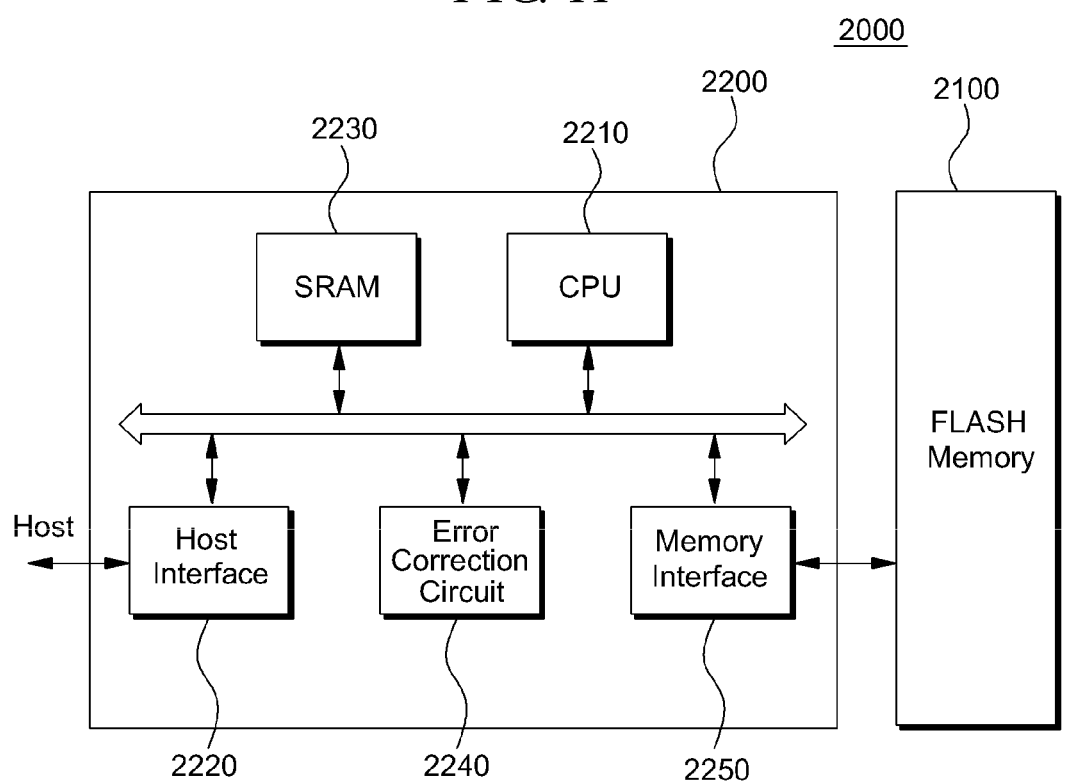
FIG. 11 is a block diagram showing a memory system according to another embodiment.

FIG. 11 is a block diagram showing a memory system 2000 according to another embodiment.

Referring to FIG. 11, the memory system 2000 may include a memory controller 2200 and a flash memory device 2100. The flash memory device 2100 may include the non-volatile memory devices 100, 200, and 300 as described above with reference to FIGS. 1 through 7B. The flash memory device 2100 may show reliable program performance.

The memory controller 2200 may control the flash memory device 2100. An SRAM 2230 may be used as an operation memory for a CPU 2210. A host interface 2220 may embody a data exchange protocol for connecting a host to the memory system 2000. An error correction circuit 2240 equipped in the memory controller 2200 may detect and correct errors included in data read out from the flash memory device 2100. A memory interface 2250 may perform interfacing with the flash memory device 2100. The CPU 2210 may perform overall control operations for data exchange of the memory controller 2200. The memory system 2000 may further include a ROM (not shown) that stores code data for interfacing with the host.

The flash memory device 2100 may communicate with an external circuit (e.g., the host) using one of various interface protocols, such as USB, MMC, PCI-E, SAS, SATA, PATA, SCSI, ESDI, or IDE. The memory system 2000 in accordance with the present embodiment may be applied to various user devices, such as an ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device capable of transmitting and receiving data wirelessly, or a home network.

Figure 12:
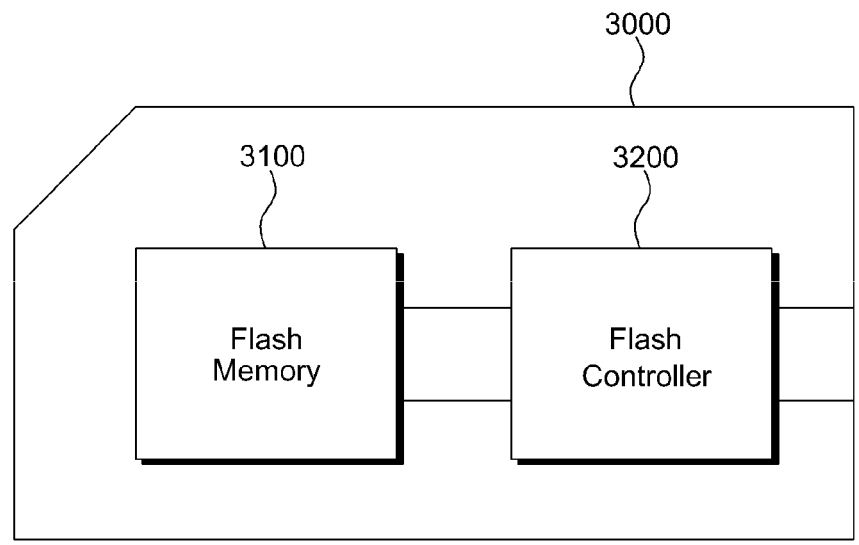
FIG. 12 is a block diagram showing a data storage device according to another embodiment.

FIG. 12 is a block diagram showing a data storage device 3000 according to another embodiment.

Referring to FIG. 12, the data storage device 3000 may include a flash memory 3100 and a flash controller 3200. The flash controller 3200 may control the flash memory 3100 based on control signals received from an external circuit. A 3-dimensional memory array structure of the flash memory 3100 may be a channel-stacked type structure, a straight-shaped bit cost scalable (BiCS) structure, or a pipe-shaped BiCS structure, but the present disclosure is not limited thereto. The 3-dimensional memory array structure of the flash memory 3100 may be a commercially-known SMArT structure or a TCAT structure.

The data storage device 3000 may constitute a memory card device, an SSD device, a multimedia card device, an SD card, a memory stick device, a hard disk drive device, a hybrid drive device, or a USB flash device. For example, the data storage device 3000 may be a memory card that satisfies a standard or a specification to be used by an electronic device, such as a digital camera or a personal computer.

Figure 13:
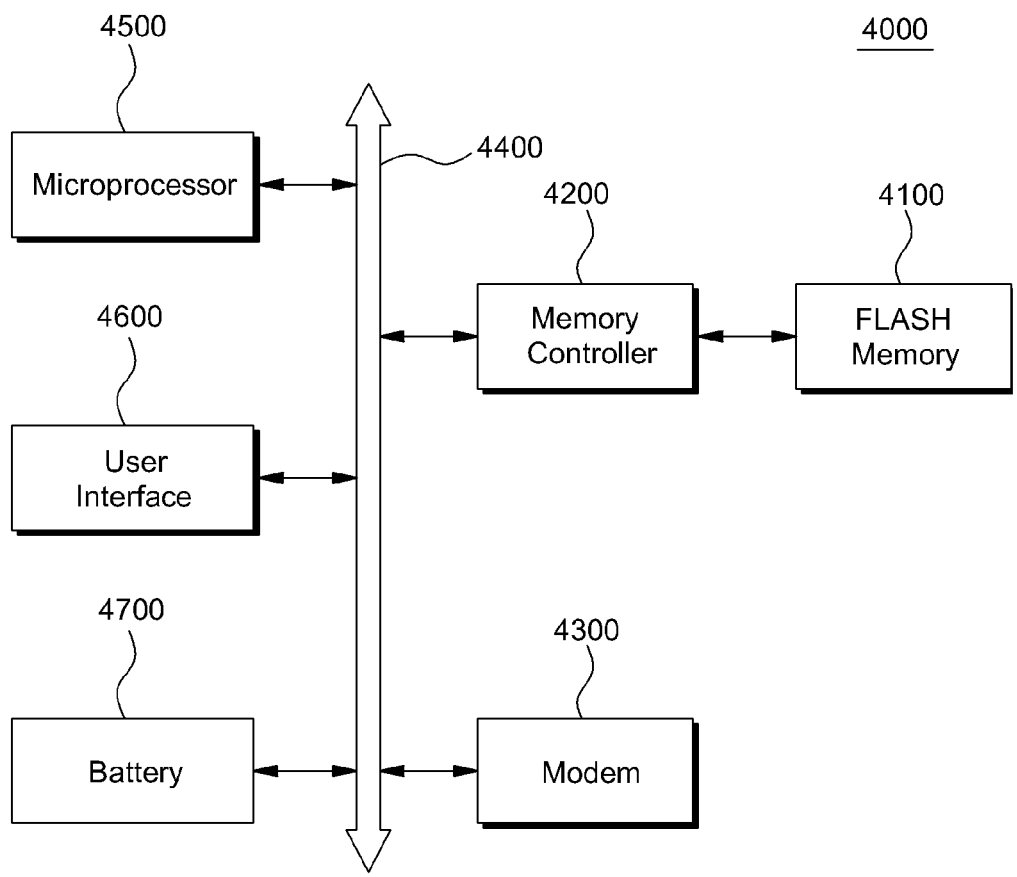
FIG. 13 is a block diagram showing a computing system including a flash memory device according to an embodiment.

FIG. 13 is a block diagram showing a computing system 4000 that includes a flash memory device 4100 according to an embodiment.

Referring to FIG. 13, the computing system 4000 in accordance with the present embodiment may further include a memory controller 4200, a modem 4300, such as a baseband chipset, a microprocessor 4500, and a user interface 4600, which are electrically connected to a bus 4400.

The flash memory device 4100 shown in FIG. 13 may be a non-volatile memory device as described above. The computing system 4000 in accordance with the present embodiment may be a mobile device. In this case, the computing system 4000 may further include a battery 4700 for supplying a power for operating the computing system 4000. Although not shown, in other embodiments, the computing system 4000 may further include an application chipset, a camera image processor (CIS), or a mobile DRAM. The memory controller 4200 and the flash memory device 4100 may constitute an SSD using a non-volatile memory device for storing data.

A non-volatile memory device and/or a memory controller according to the present disclosure may be mounted using various types of packages. For example, a non-volatile memory device and/or a memory controller may be mounted using any of various packages, such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (S SOP), Thin Small Outline (TSOP), System In Package (SIP), Multi Chip Package (MCP), Wafer-level Fabricated Package (WFP), or Wafer-Level Processed Stack Package (WSP).

While embodiments of the present disclosure have been particularly shown and described, it will be understood by those of ordinary skill in the art that various changes in form and details may be made therein without departing from the spirit and scope of the following claims.

What is claimed is:

1. A non-volatile memory device comprising:
   a channel layer;
   a data storage layer disposed on the channel layer;
   a plurality of control gates arranged on the data storage layer and spaced apart from one another, the plurality of control gates comprising a first conductor having a first work function; and
   conductive cover layers disposed on sidewalls of control gates facing each other, the conductive cover layers comprising a second conductor having a second work function that is greater than the first work function so that at least one of a density of program charges trapped in inter-memory cell areas, a distribution width of the program charges trapped in inter-memory cell areas, a magnitude of a fringing field emitted from the sidewalls of a selected control gate toward the channel layer, and a dispersion width of the fringing field is reduced more compared to that of a memory device without the conductive cover layers.

2. The non-volatile memory device of claim 1, wherein the conductive cover layers are further disposed on top surfaces of the plurality of control gates.

3. The non-volatile memory device of claim 1, wherein the first conductor and the second conductor are different from each other, and each of the first conductor and the second conductor is selected from a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

4. The non-volatile memory device of claim 1, wherein the second conductor is formed by modifying a surface of the first conductor.

5. The non-volatile memory device of claim 4, wherein the surface of the first conductor is modified by performing impurity implantation, silicidification, or a surface treatment on the surface of the first conductor.

6. The non-volatile memory device of claim 1, wherein the data storage layer comprises:
   a tunneling insulation layer contacting the channel layer;
   a blocking insulation layer contacting the plurality of control gates; and
   a charge trapping storage layer disposed between the tunneling insulation layer and the blocking insulation layer.

7. The non-volatile memory device of claim 1, wherein a ratio $W_2/W_1$ of a second width $W_2$ of the conductive cover layer to a first width $W_1$ of each of the plurality of control gates is from about 0.01 to about 0.5.

8. The non-volatile memory device of claim 1, wherein a width of the conductive cover layer is less than or equal to a half of a distance between two adjacent control gates.

9. The non-volatile memory device of claim 1, wherein the channel layer extends in a direction vertical to a main surface of a substrate on which the non-volatile memory device is formed.

10. The non-volatile memory device of claim 9, wherein the non-volatile memory device has a SMArT structure, a bit cost scalable (BiCS) structure, a piped BiCS (P-BiCS) structure, a vertical-recess-array-transistor structure, or a terabit cell array transistor (TCAT) structure.

11. The non-volatile memory device of claim 1, wherein at least a portion of the data storage layer fills spaces between the plurality of control gates.

12. A method of fabricating a non-volatile memory device comprising a channel layer, a data storage layer disposed on the channel layer, a plurality of control gates arranged on the data storage layer and spaced apart from one another, and conductive cover layers disposed on sidewalls of control gates facing each other, the method comprising:
   forming a stacked structure by alternately and repeatedly forming one or more insulation layers and one or more conductive layers on a substrate;
   forming via holes extending in a vertical direction that is normal to a main surface of the substrate by patterning the stacked structure;
   forming the data storage layer on a sidewall of each of the via holes; and
   forming a semiconductor pillar comprising the channel layer in a groove area defined by the data storage layer in each of the via holes,
   wherein forming the one or more conductive layers comprises:
      forming a first conductive layer, the first conductive layer being configured to be a control gate having a first work function; and
      forming a second conductive layer, the second conductive layer being configured to be a conductive cover layer having a second work function that is greater than the first work function so that at least one of a density of program charges trapped in inter-memory cell areas, a distribution width of the program charges trapped in the inter-memory cell areas, a magnitude of a fringing field emitted from the sidewalls of a selected control gate toward the channel layer, and a dispersion width of the fringing field is reduced more compared to that of a memory device without the conductive cover layers,
   wherein the second conductive layer is formed on at least one of a top surface and a bottom surface of the first conductive layer in the vertical direction.

13. The method of claim 12, wherein the first conductor and the second conductor are different from each other, and each of the first conductor and the second conductor is selected from a doped poly-silicon, aluminum (Al), copper (Cu), tungsten (W), cobalt (Co), nickel (Ni), chromium (Cr), manganese (Mn), palladium (Pd), zirconium (Zr), gold (Au), platinum (Pt), iridium (Ir), titanium (Ti), tantalum (Ta), molybdenum (Mo), ruthenium (Ru), rhodium (Rh), vanadium (V), erbium (Er), a conductive silicide thereof, a conductive nitride thereof, and a conductive oxide thereof.

14. The method of claim 12, wherein the second conductor is formed by modifying a surface of the first conductor.

15. The method of claim 14, wherein the surface of the first conductor is modified by performing impurity implantation, silicidification, or a surface treatment on the surface of the first conductor.

16. The method of claim 12, wherein forming the data storage layer comprises:
- forming a blocking insulation layer on the sidewall of each of the via holes so that the blocking insulation layer contacts a plurality of control gates formed by patterning the stacked structure;
- forming a charge trapping storage layer on the blocking insulation layer; and
- forming a tunneling insulation layer on the charge trapping storage layer,
- wherein the tunneling insulation layer contacts the channel layer.

17. The method of claim 12, wherein a ratio $W_2/W_1$ of a second width $W_2$ of the second conductive layer to a first width $W_1$ of the first conductive layer is from 0.01 to 0.5, the first width $W_1$ and the second width $W_2$ being determined in the vertical direction.

18. The method of claim 17, wherein the second width $W_2$ of the second conductive layer is less than or equal to a half of a distance between two adjacent first conductive layers in the vertical direction.

19. The method of claim 12, wherein the non-volatile memory device has a SMArT structure, a bit cost scalable (BiCS) structure, a piped BiCS (P-BiCS) structure, a vertical-recess-array-transistor) structure, or a terabit cell array transistor (TCAT) structure.

20. The method of claim 12, wherein at least a portion of the data storage layer is formed to fill spaces between a plurality of control gates that are formed by patterning the stacked structure.

* * * * *